United States Patent [19]
Terasima et al.

[11] Patent Number: 5,574,303
[45] Date of Patent: Nov. 12, 1996

[54] SEMICONDUCTOR VOLTAGE SENSING DEVICE

[75] Inventors: Tomohide Terasima; Mituharu Tabata, both of Fukuoka; Masao Yoshizawa; Kazumasa Satsuma, both of Itami, all of Japan

[73] Assignee: Mitsubishi Denki Kabushiki Kaisha, Tokyo, Japan

[21] Appl. No.: 325,633

[22] Filed: Oct. 19, 1994

Related U.S. Application Data

[63] Continuation of Ser. No. 991,367, Dec. 15, 1992, abandoned.

[30] Foreign Application Priority Data

Jan. 6, 1992 [JP] Japan ..................... 4-000217

[51] Int. Cl.$^6$ ................. H01L 29/76; H01L 29/94
[52] U.S. Cl. ............. 257/401; 257/343; 257/367; 257/409; 257/577; 257/587
[58] Field of Search ................. 257/401, 653, 257/327, 329, 335, 336, 337, 343, 561, 562, 563, 367, 577, 587

[56] References Cited

U.S. PATENT DOCUMENTS

| | | | |
|---|---|---|---|
| 3,307,110 | 2/1967 | Harwood | 257/401 |
| 4,012,684 | 3/1977 | Schade, Jr. | 323/8 |
| 4,056,810 | 11/1977 | Hart et al. | 365/205 |
| 4,339,765 | 7/1982 | Nakamura et al. | 257/561 |
| 4,349,906 | 9/1982 | Scifres et al. | 372/50 |
| 4,908,682 | 3/1990 | Takahashi | 257/336 |
| 5,023,693 | 6/1991 | Mori et al. | 257/563 |

FOREIGN PATENT DOCUMENTS

| | | | |
|---|---|---|---|
| 57-211262 | 12/1982 | Japan | 257/563 |
| 63-138779 | 6/1988 | Japan | 257/653 |

OTHER PUBLICATIONS

Sedra et al, "Microelectronic circuits", pp. 440–443, 1982.
Muller et al, "Device Electronics for Integrated circuits", Second Edition, pp. 366 to 368, 1986.
IBM Technical Disclosure Bulletin, vol. 24, No. 8, pp. 4031–4032, Jan. 1982, R. A. Muggi, "Top Lateral, PNP Transistor".
Solid State Electronics, vol. 10, pp. 225–234, 1967, J. Lindmayer, et al., "Theory Of Lateral Transistors".

*Primary Examiner*—Ngân Ngô
*Attorney, Agent, or Firm*—Oblon, Spivack, McClelland, Maier & Neustadt, P.C.

[57] ABSTRACT

The present invention provides a semiconductor device which is excellent in voltage sense characteristic and simple in manufacturing process. P diffusion regions 12 and 13 are selectively formed on a first major surface of an N⁻ substrate 11, an electrode 31 is formed on the P diffusion region, a sense electrode 32 is formed on the P diffusion region 13, and an electrode 33 is formed on a second major surface of the N⁻ substrate. Then, the electrode 31 is set at 0 V, constant current is led to the sense electrode 32, and the electrode 33 is positively biased. Thus, the voltage applied to the electrode 33 is sensed from a potential obtained at the sense electrode 32. A distance between the P diffusion regions 12 and 13 which determines a voltage sense characteristic can be accurately controlled, and a good voltage sense characteristic can be obtained. Moreover, a manufacturing process is relatively simple.

16 Claims, 17 Drawing Sheets 5,574,303

SEMICONDUCTOR VOLTAGE SENSING DEVICE

This application is a continuation of application Ser. No. 07/991,367, filed on Dec. 15, 1992, now abandoned.

BACKGROUND OF THE INVENTION

1. Field of the Invention

The present invent ion relates to a semiconductor device which has a voltage sense function by which voltage between main electrodes can be measured by measuring smaller sense voltage.

2. Description of the Prior Art

FIG. 27 is a sectional view showing a configuration of a conventional voltage sense device. As shown in FIG. 27, an $N^-$ epitaxial layer 2 is formed on a $P^-$ substrate 1, and the $N^-$ epitaxial layer 2 is separated by a P diffusion separating region 3. An $N^+$ buried region 4 is formed in part of an interface between the $P^-$ substrate 1 and the $N^-$ epitaxial layer 2, an $N^+$ diffusion region 6 is formed extending from top of the $N^+$ buried region 4 to a surface of the $N^-$ epitaxial layer 2, and a P diffusion region 5 and an $N^+$ diffusion region 7 are selectively formed in the surface of the $N^-$ epitaxial layer 2.

Then, an electrode 21 is formed on the P diffusion separating region 3, a sense electrode 22 is formed on the $N^+$ diffusion region 6, an electrode 23 is formed on the $N^+$ diffusion region 7, and an electrode 24 is formed on the P diffusion region 5. Reference numeral 26 denotes an insulating film.

In such a configuration, when the electrode 21 and 24 are set at a ground level and voltage applied to the electrode 23 is gradually raised, depletion layers expand in PN junctions between the $P^-$ substrate 1 and the $N^-$ epitaxial layer 2 and between the P diffusion region 5 and the $N^-$ epitaxial layer 2, as shown in FIG. 28. Dot-and-dash lines in FIG. 28 show an expansion of the depletion layers.

At this time, the depletion layers expanding from the P diffusion region 5 and the $P^-$ substrate 1 towards the $N^-$ epitaxial layer 2 cause a 3unction type FET (JFET) of PN junction having a width X in FIG. 27 in the $N^-$epitaxial layer 2 to be activated, and the electrode 23 and the sense electrode 22 assume an identical value in voltage until the depletion layers pinch off, but once they have pinched off as shown in FIG. 29, the depletion layers separate voltage at the electrode 23 from that at the sense electrode 22, which causes the sense electrode 22 no longer to rise. Dot-and-dash lines in FIG. 29 show an expansion of the depletion layers.

FIG. 30 is a graph showing sense voltage V22 at the sense electrode 22 related to voltage V23 applied to the electrode 23. As shown in FIG. 30, once the applied voltage V23 rises over pinch-off voltage VP and the depletion layers pinch off as shown in FIG. 29, the sense voltage V22 can scarcely rise even if the applied voltage V23 becomes larger. As a result, the applied voltage V23 at high level can be sensed by the measured voltage V22 at low level.

A conventional voltage sense device is configured as mentioned above, and its voltage sense characteristic depends upon a JFET configuration, where, for example, the voltage sense characteristic is determined by dimensions, X and Y, in FIG. 27 and a value of epitaxial resistivity in the $N^-$ epitaxial layer 2, and especially, the dimension Y and the epitaxial resistivity are values for determining the pinch-off voltage of the JFET.

However, it is difficult to accurately determine the dimension X because of mask shear and diffusion dispersion in forming the $N^+$ buried region 4 and the P diffusion region 5. Also, it is difficult to accurately control an epitaxial resistivity of the $N^-$epitaxial layer 2. Moreover, it is difficult to control a film thickness of the $N^-$ epitaxial layer 2, and it is also difficult to accurately determine the dimension Y because of diffusion dispersion of the P diffusion region 5 and the like.

Thus, in the conventional voltage sense device, there are variations in a variety of parameters for determining a voltage sense characteristic, and therefore, there is a problem that it is impossible to get a good voltage sense characteristic. Also, it is necessary to provide the $N^+$ buried region 4 to obtain a JFET configuration, and there arises a problem that a manufacturing process is complicated.

SUMMARY OF THE INVENTION

According to the present invention, a semiconductor device includes a semiconductor substrate of a first conductivity type having first and second major surfaces; a first semiconductor region of a second conductivity type selectively formed in the first major surface of the semiconductor substrate; a second semiconductor region of the second conductivity type selectively formed in the first major surface of the semiconductor substrate independent of the first semiconductor region; a first main electrode formed on the first semiconductor region; a sense electrode formed on the second semiconductor region; and a second main electrode formed on the second major surface of the semiconductor substrate.

Preferably, the first semiconductor region is formed circular in plane configuration.

Preferably, the second semiconductor region is formed annular in plane configuration in a position a predetermined distance away from the circumference of the first semiconductor region.

Preferably, the first conductivity type is an N type while the second conductivity type is a P type.

Preferably, the second semiconductor region is formed circular in plane configuration while the first semiconductor region is formed annular in plane configuration in a position a predetermined distance away from the circumference of the second semiconductor region.

Preferably, the semiconductor device further includes an insulating film formed on the semiconductor substrate between the first semiconductor region and the second semiconductor region; and a control electrode formed on the insulating film.

Preferably, the first semiconductor region is formed circular in plane configuration while the second semiconductor region is formed annular in plane configuration in a position a predetermined distance away from the circumference of the first semiconductor region.

Preferably, the second semiconductor region is formed circular in plane configuration while the second semiconductor region is formed annular in plane configuration in a position a predetermined distance away from the circumference of the second semiconductor region.

A semiconductor device includes a semiconductor substrate of a first conductivity type having first and second major surfaces; a first semiconductor region of a second conductivity type selectively formed in the first major surface of the semiconductor substrate; a second semiconductor region of the second conductivity type selectively formed in the first major surface of the semiconductor substrate independent of the first semiconductor region; a third semiconductor region of the first conductivity type selectively formed in the first major surface of the semiconductor substrate independent of the first and second semiconductor regions; a first main electrode formed on the first semiconductor region; a sense electrode formed on the second semiconductor region; and a second main electrode formed on the third semiconductor region.

Preferably, the first semiconductor region is formed circular in plane configuration, the second semiconductor region is formed annular in plane configuration in a position a predetermined distance away from the circumference of the first semiconductor region, and the third semiconductor region is formed annular in plane configuration along the circumference of the second semiconductor region.

Preferably, the third semiconductor region is formed circular in plane configuration, the second semiconductor region is formed annular in plane configuration along the circumference of the third semiconductor region, and the first semiconductor region is formed annular in plane configuration in a position a predetermined distance away from the circumference of the second semiconductor region.

Preferably, the semiconductor device further includes an insulating film formed on the semiconductor substrate between the first and second semiconductor regions; and a control electrode formed on the insulating film.

A semiconductor device includes a semiconductor substrate of a second conductivity type having first and second major surfaces; a semiconductor layer of a first conductivity type formed on the first major surface of the semiconductor substrate; a first semiconductor region of the second conductivity type selectively formed in a surface of the semiconductor layer; a second semiconductor region of the second conductivity type selectively formed in a surface of the semiconductor layer independent of the first semiconductor region; a third semiconductor region of the first conductivity type selectively formed in a surface of the semiconductor layer independent of the first and second semiconductor regions; a first main electrode formed on the first semiconductor region; a sense electrode formed on the second semiconductor region; a second main electrode formed on the third semiconductor region; and a third main electrode formed on the second ma3or surface of the semiconductor substrate.

Preferably the semiconductor device further includes an insulating film formed on the semiconductor layer between the first and second semiconductor regions; and a control electrode formed on the insulating film.

Preferably, the first semiconductor region is formed circular in plane configuration, the second semiconductor region is formed annular in plane configuration in a position a predetermined distance away from the circumference of the first semiconductor region, and the third semiconductor region is formed annular in plane configuration along the circumference of the second semiconductor region.

Preferably, the third semiconductor region is formed circular in plane configuration, the second semiconductor region is formed annular in plane configuration along the circumference of the third semiconductor region, and the first semiconductor region is formed annular in plane configuration in a position a predetermined distance away from the circumference of the second semiconductor region.

A semiconductor device includes the steps of preparing a semiconductor substrate of a first conductivity type having first and second major surfaces; selectively forming first and second semiconductor regions of a second conductivity type in the first major surface of the semiconductor substrate independent of each other; forming a first main electrode on the first semiconductor region; forming a sense electrode on the second semiconductor region; and forming a second main electrode on the second major surface of the semiconductor substrate.

Preferably, the first semiconductor region is formed circular in plane configuration.

Preferably, the second semiconductor region is formed annular in plane configuration in a position a predetermined distance away from the circumference of the first semiconductor region.

Preferably, the first conductivity type is an N type while the second conductivity type is a P type.

Preferably, the second semiconductor region is formed circular in plane configuration, while the first semiconductor region is formed annular in plane configuration in a position a predetermined distance away from the circumference of the second semiconductor region.

Preferably, the method further includes the steps of forming an insulating film on the semiconductor substrate between the first and second semiconductor regions; and forming a control electrode on the insulating film.

A method of manufacturing a semiconductor device includes the steps of preparing a semiconductor substrate of a first conductivity type having first and second major surfaces; selectively forming an insulating film on the semiconductor substrate; forming a control electrode on the insulating film; selectively forming first and second semiconductor regions of the second conductivity type in the first major surface of the semiconductor substrate independent of each other, using a mask of the control electrode; forming a first main electrode on the first semiconductor region; forming a sense electrode on the second semiconductor region; and forming a second main electrode on the second major surface of the semiconductor substrate.

Preferably, the first semiconductor region is formed circular in plane configuration while the second semiconductor region is formed annular in plane configuration in a position a predetermined distance away from the circumference of the first semiconductor region.

Preferably, the second semiconductor region is formed circular in plane configuration while the first semiconductor region is formed annular in plane configuration in a position a predetermined distance away from the circumference of the second semiconductor region.

A method of manufacturing a semiconductor device includes the steps of preparing a semiconductor substrate of a first conductivity type having first and second major surfaces; selectively forming first and second semiconductor regions of a second conductivity type in the first major surface of the semiconductor substrate independent of each other; selectively forming a third semiconductor region of the first conductivity type in the first major surface of the semiconductor substrate; forming a first main electrode on the first semiconductor region; forming a sense electrode on the second semiconductor region; and forming a second main electrode on the third semiconductor region.

Preferably, the first semiconductor region is formed circular in plane configuration, the second semiconductor region is formed annular in plane configuration in a position a predetermined distance away from the circumference of the first semiconductor region, and the third semiconductor region is formed annular in plane configuration along the circumference of the second semiconductor region.

Preferably, the third semiconductor region is formed circular in plane configuration, the second semiconductor region is formed annular in plane configuration along the circumference of the third semiconductor region, and the first semiconductor region is formed annular in plane configuration in a position a predetermined distance away from the circumference of the semiconductor region.

A method of manufacturing a semiconductor device includes the steps of preparing a semiconductor substrate of a first conductivity type having first and second major surfaces; selectively forming an insulating film on the semiconductor substrate; forming a control electrode on the insulating film; selectively forming first and second semiconductor regions of a second conductivity type in the first major surface of the semiconductor substrate independent of each other, using a mask of the control electrode; selectively forming a third semiconductor region of the first conductivity type in the first major surface of the semiconductor substrate; forming a first main electrode on the first semiconductor region; forming a sense electrode on the second semiconductor region; and forming a second main electrode on the third semiconductor region.

A method of manufacturing a semiconductor device includes the steps of preparing a semiconductor substrate of a second conductivity type having first and second major surfaces; forming a semiconductor layer of a first conductivity type on the first major surface of the semiconductor substrate; selectively forming first and second semiconductor regions of the second conductivity type in a surface of the semiconductor layer independent of each other; selectively forming a third semiconductor region of the first conductivity type in the surface of the semiconductor layer independent of the first and second semiconductor regions; forming a first main electrode on the first semiconductor region; forming a sense electrode on the second semiconductor region; forming a second main electrode on the third semiconductor region; and forming a third main electrode on the second major surface of the semiconductor substrate.

Preferably the method further includes the steps of forming an insulating film on the semiconductor substrate between the first and second semiconductor regions; and forming a control electrode on the insulating film.

A method of manufacturing a semiconductor device includes the steps of preparing a semiconductor substrate of a second conductivity type having first and second major surfaces; forming a semiconductor layer of a first conductivity type on the first major surface of the semiconductor substrate; selectively forming an insulating film on the semiconductor layer; forming a control electrode on the insulating film; selectively forming first and second semiconductor regions of a second conductivity type in the first major surface of the semiconductor layer independent of each other, using a mask of the control electrode; selectively forming a third semiconductor region of the first conductivity type in a surface of the semiconductor layer independent of the first and second semiconductor regions; forming a first main electrode on the first semiconductor region; forming a sense electrode on the second semiconductor region; forming a second main electrode on the third semiconductor region; and forming a third main electrode on the second major surface of the semiconductor substrate.

Preferably, the first semiconductor region is formed circular in plane configuration, the second semiconductor region is formed annular in plane configuration in a position a predetermined distance away from the circumference of the first semiconductor region, and the third semiconductor region is formed annular in plane configuration along the circumference of the second semiconductor region.

Preferably, the third semiconductor region is formed circular in plane configuration, the second semiconductor region is formed annular in plane configuration along the circumference of the third semiconductor region, and the first semiconductor region is formed annular in plane configuration in a position a predetermined distance away from the circumference of the second semiconductor region.

In the semiconductor device defined in claims 1 and 2 of the present invention, voltage is applied to the first and second main electrodes so that a PN junction developed in an interface between the semiconductor substrate and the first semiconductor region may be reversely biased, and it is arranged that constant current flows in the sense electrode. This allows a depletion layer to expand from the PN junction as a potential difference between the first and second main electrodes is made larger, and because of an existence of the depletion layer, a sense voltage characteristic can be obtained that an extent of the rising of a potential at the sense electrode is suppressed as a potential difference between the first and second main electrodes proceeds to a high level.

The voltage sense characteristic depends upon a distance between the first and second semiconductor regions, and since the first and second semiconductors can be simultaneously formed in the same manufacturing process, the distance between the first and second semiconductor regions can be accurately set.

Accordingly, it is an object of the present invention to provide a semiconductor device with a voltage sense function which is excellent in voltage sense characteristic and simple in manufacturing process.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
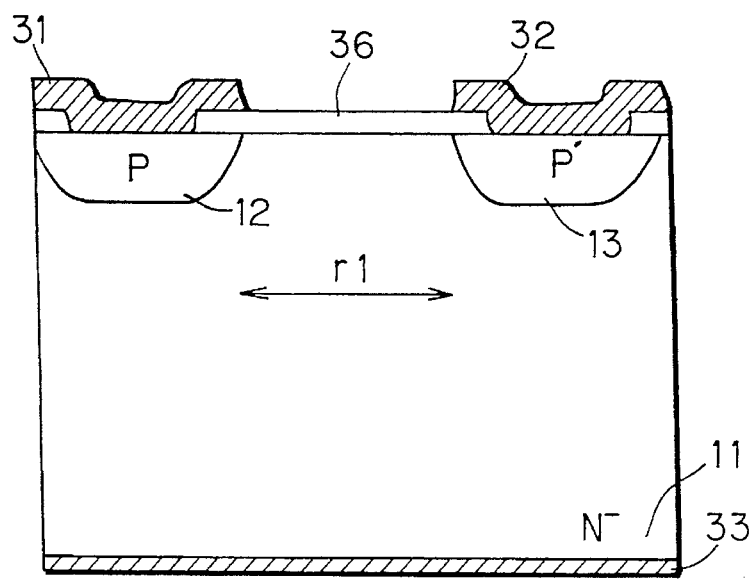
FIG. 1 is a sectional view showing a configuration of a voltage sense device of a first embodiment according to the present invention.

FIG. 1 is a sectional view showing a configuration of a voltage sense device of a first preferred embodiment according to the present invention. As shown in FIG. 1, a P diffusion region 12 and a P diffusion region 13 are selectively formed in a first major surface of an N⁻ substrate 11. An electrode 31 or a first main electrode is formed on the P diffusion region 12, a sense electrode 32 is formed on the P diffusion region 13, an electrode 33 or a second main electrode is formed on a second major surface of the N⁻ substrate 11. Reference numeral 36 denotes an insulating film.

Figure 2:
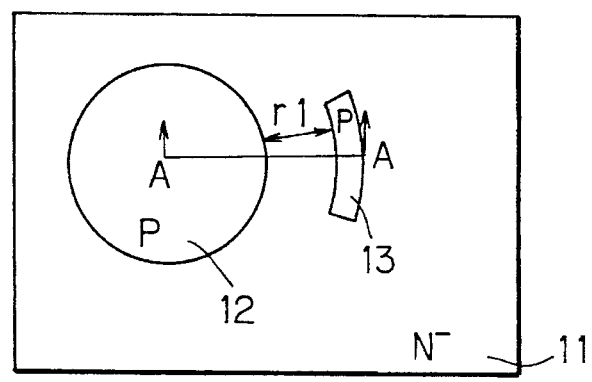
FIG. 2 is a plan view showing a plane configuration of the voltage sense device shown in FIG. 1.
Figure 3:
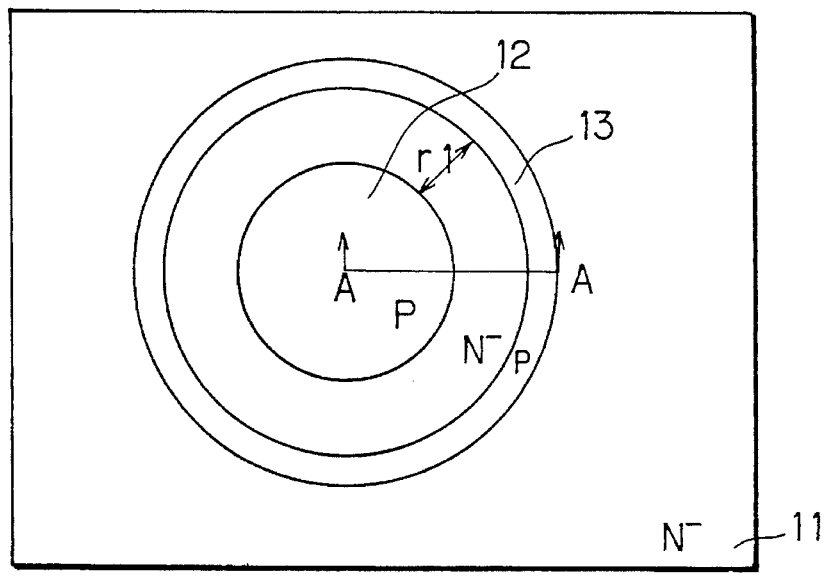
FIG. 3 is a plan view showing a plane configuration of the voltage sense device shown in FIG. 1.
Figure 4:
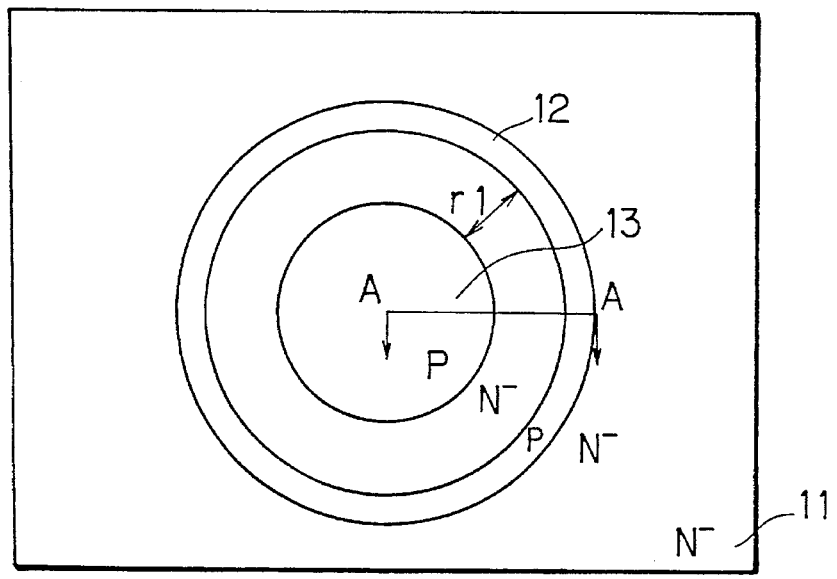
FIG. 4 is a plan view showing a plane configuration of the voltage sense device shown in FIG. 1.

FIGS. 2 to 4 are plan views showing a plane configuration of the first embodiment shown in FIG. 1, respectively, and a section taken along A—A of FIGS. 2 to 4 is shown in FIG. 1. The electrode 31, sense electrode 32 and insulating film 36 are omitted in these figures. The P diffusion region 13 is formed a distance r1 away from a point on the circumference of the circular P diffusion region 12 in the plane configuration of FIG. 2, while the P diffusion region 13 is formed a distance r1 away from the circumference of the circular P diffusion region 12 in the plane configuration of FIG. 13, and the P diffusion region 12 is formed annular in shape a distance r1 away from the circumference of the circular P diffusion region 13.

Figure 5:
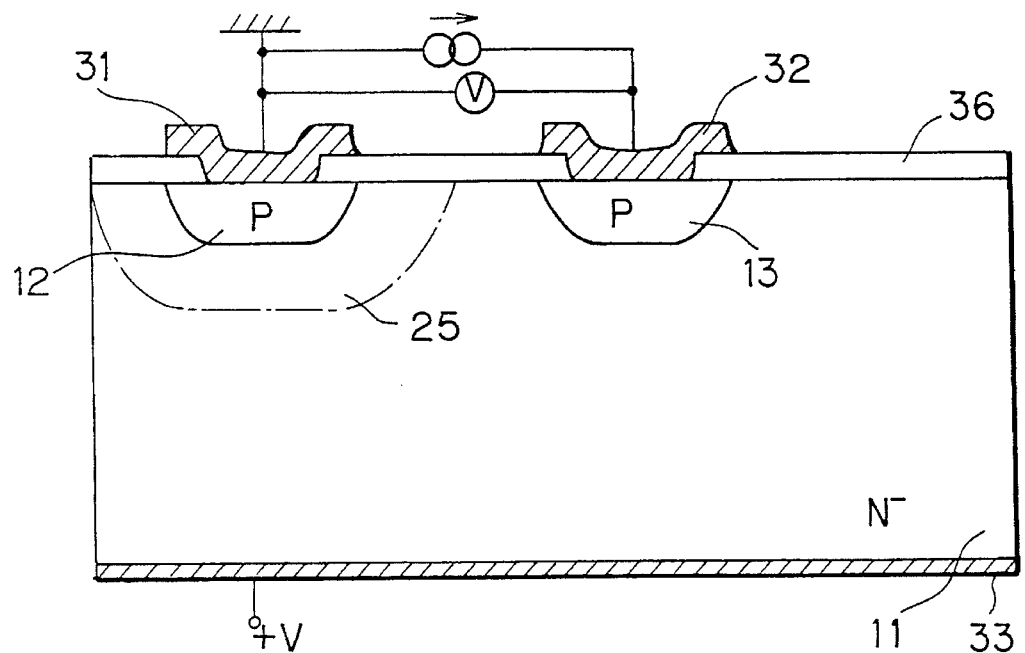
FIG. 5 is a model sectional view for explaining an operation of the voltage sense device of the first embodiment.
Figure 6:
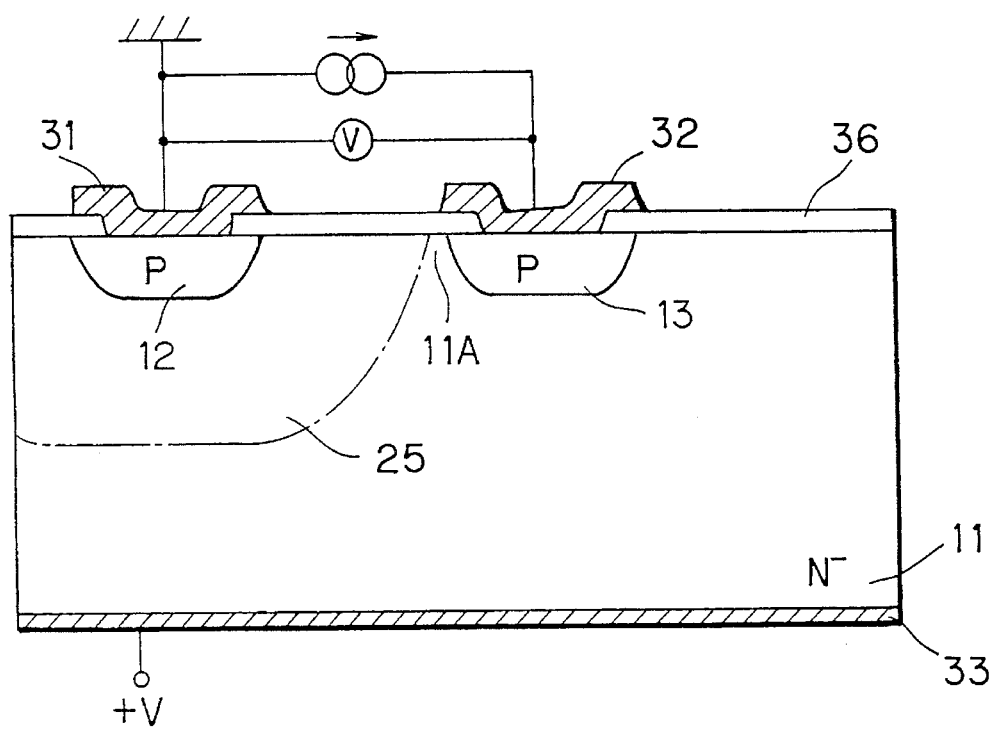
FIG. 6 is a model sectional view for explaining the operation of the voltage sense device of the first embodiment.
Figure 7:
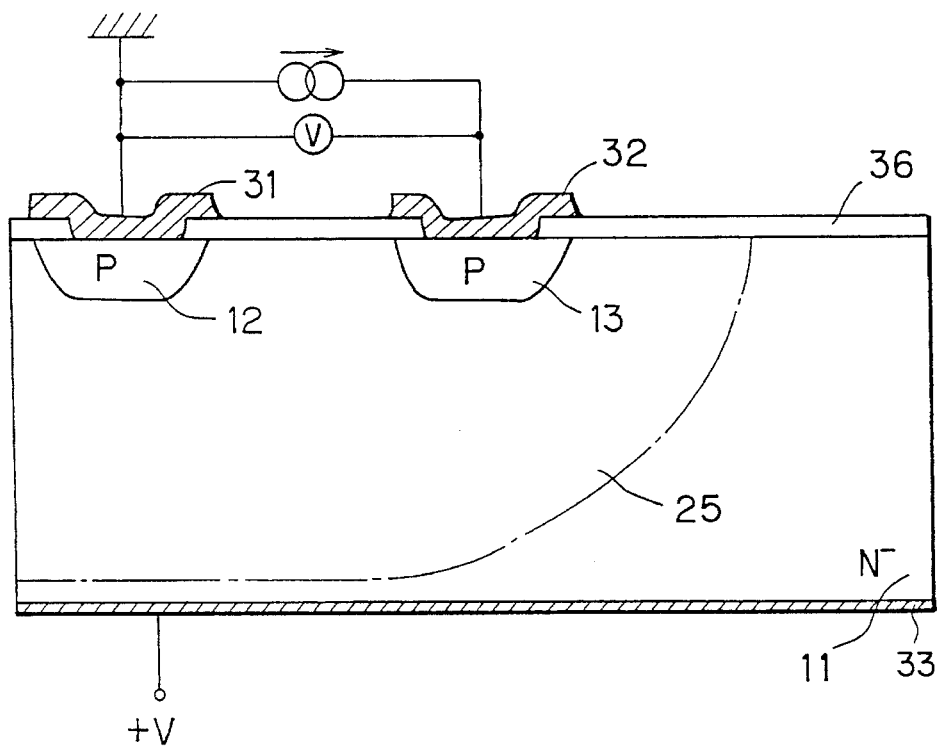
FIG. 7 is a model sectional view for explaining the operation of the voltage sense device of the first embodiment.

FIGS. 5 to 7 are model sectional views for explaining the operation of the voltage sense device of the first preferred embodiment. Now, the voltage sense operation of the first preferred embodiment will be described with reference to these figures.

First, setting the electrode 31 at 0 V, constant current is led to the sense electrode 32, and the electrode 33 is positively biased. This causes a PN junction between the P diffusion region 12 and the N⁻ substrate 11 to be reversely biased, and hence, a depletion layer 25 expands towards the N⁻ substrate 11. At this time, a depletion layer slightly expands from a PN junction between the P diffusion region 13 and the N⁻ substrate 11 towards the N⁻ substrate 11, but there is no inconvenience to ignore this for an explanation of the operation. Therefore, the depletion layer is omitted in FIGS. 5 to 7.

Figure 8:
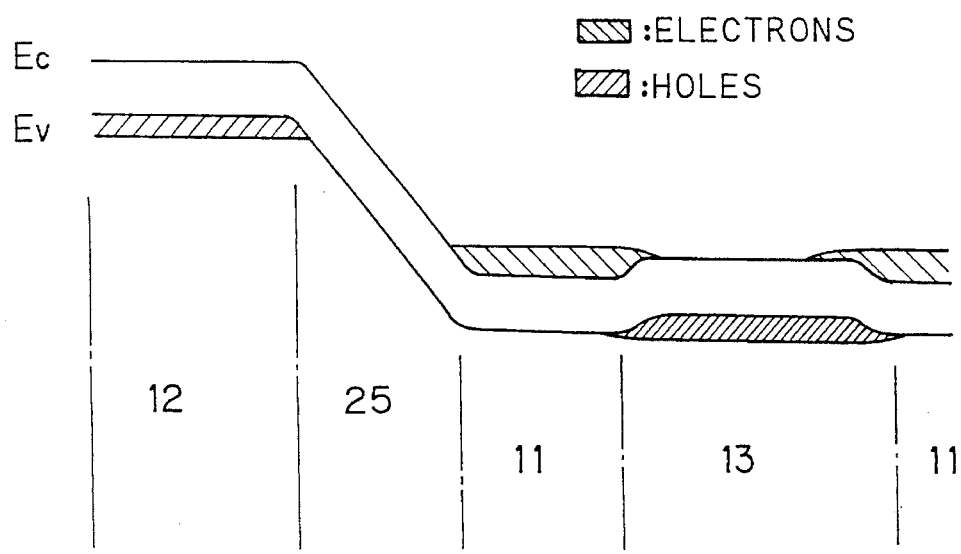
FIG. 8 is a diagram showing an energy band for explaining the operation of the voltage sense device of the first embodiment.

As shown in FIG. 5, when the depletion layer 25 expanding from the PN junction between the P diffusion region 12 and the N⁻ substrate 11 towards the N⁻ substrate 11 lies relatively apart from the P diffusion region 13, the constant current led to the sense electrode 32 forwardly biases the PN junction of the P diffusion region 13 and the N⁻ substrate 11 to cause a state where holes are introduced into the N⁻ substrate 11, and therefore, the sense electrode 32 assumes a higher voltage than the electrode 33 by the worth of the forward bias of the PN junction of the P diffusion region 13 and the N⁻ substrate 11. FIG. 8 shows an energy band along a surface of the N⁻ substrate 11 at this time.

When applied voltage V33 to the electrode 33 further rises and the depletion layer 25 expands close to the P diffusion region 13 as shown in FIG. 6, a surface region 11A of the N⁻ substrate 11 between the P diffusion region 13 and the depletion layer 25 gets thinner, and hence, the constant current led to the sense electrode 32 flows as collector-emitter current in a PNP bipolar transistor comprised of the P diffusion region 12, N⁻ substrate 11 and P diffusion region 13.

Figure 9:
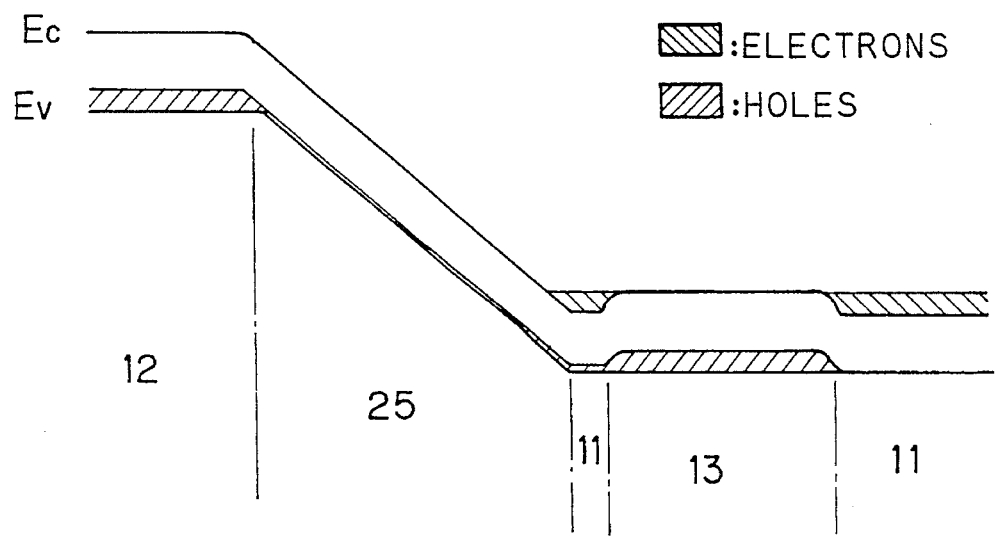
FIG. 9 is a diagram showing an energy band for explaining the operation of the voltage sense device of the first embodiment.

Thus, as most of the holes introduced into the N⁻ substrate 11 drift to the P diffusion region 12 and the depletion layer 25 expands close to the P diffusion region 13, a width of the surface region 11A of the N⁻ substrate 11, or a base width of the PNP bipolar transistor, becomes smaller. Hence, the forward bias voltage at the sense electrode 32 related to the electrode 33, which is caused by the constant current led to the sense electrode 32, becomes lower. An energy band along the N⁻ substrate 11 at this time is shown in FIG. 9.

Figure 10:
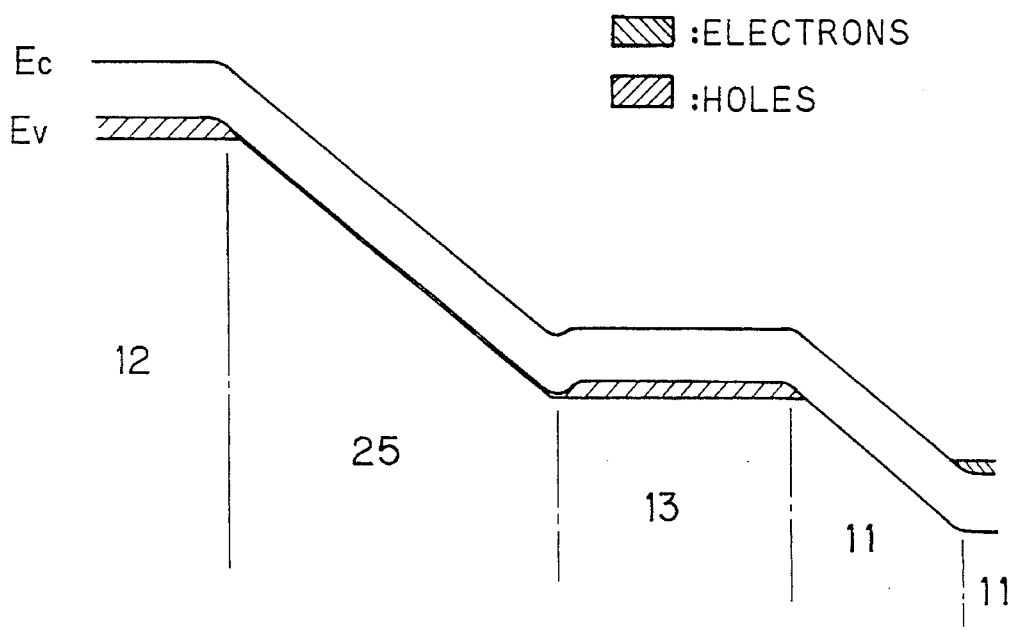
FIG. 10 is a diagram showing an energy band for explaining the operation of the voltage sense device of the first embodiment.

Then, as shown in FIG. 7, when the depletion layer 25 reaches the P diffusion region 13, the constant current led to the sense electrode 32 all drifts from the P diffusion region 13 to the P diffusion region 12 as a hole current. The voltage at the sense electrode 32 is a voltage for holding the constant current added to a voltage in floating, the voltage at the sense electrode 32 is suppressed not to rise in contrast with voltage rising at the electrode 33. An energy band along the surface of the N⁻ substrate 11 is shown in FIG. 10.

Figure 11:
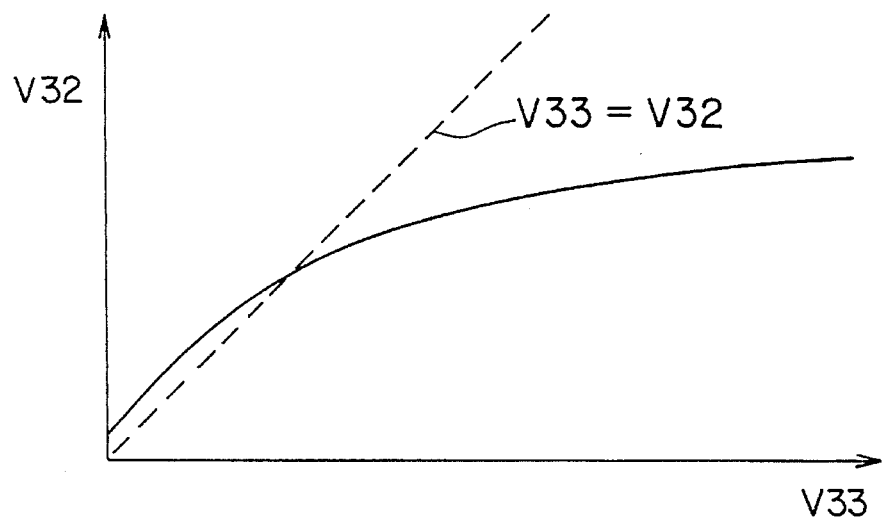
FIG. 11 is a graph showing a voltage sense characteristic in the voltage sense device of the first embodiment.

FIG. 11 is a graph showing a variation in the sense voltage V32 at the sense electrode 32 related to the applied voltage V33 to the electrode 33. As can be seen, the sense voltage V32 is suppressed at low level even when the applied voltage V33 reaches high level, and thus, a good voltage sense characteristic can be gained.

A manufacturing method of the first embodiment will now be described with reference to FIGS. 1 to 4. First, the surface of the N⁻ substrate 11 is coated with resist after the formation of an oxidation film, and the resist is patterned. Then, using a mask of the patterned resist, a P-type impurity is implanted, and thereafter, the impurity is diffused to simultaneously form the P diffusion regions 12 and 13. After the insulating film 36 is formed over the N⁻ substrate 11 entire, contact holes are formed in the insulating film 36 on the P diffusion regions 12 and 13. Then, the electrode 31 is formed on the P diffusion region 12, the sense electrode 32 is formed on the P diffusion region 13, and the electrode 33 is formed on the second major surface of the N⁻ substrate 11, and thus, the voltage sense device of the first preferred embodiment is manufactured.

A voltage sense characteristic of the voltage sense device of the first preferred embodiment which is manufactured in the above-mentioned way depends upon a distance r1 between the P diffusion regions 12 and 13 (see FIGS. 1 to 3). Since the P diffusion regions 12 and 13 are formed by simultaneously implanting a P-type impurity in the same process using the same mask (patterned resist), the distance r1 between the P diffusion regions 12 and 13 can be adequately set. Thus, a stable sense voltage characteristic can be obtained. Moreover, the above-mentioned manufacturing process is simplified because a steps of manufacturing a buried layer and the like are needless unlike the prior art embodiment.

Figure 12:
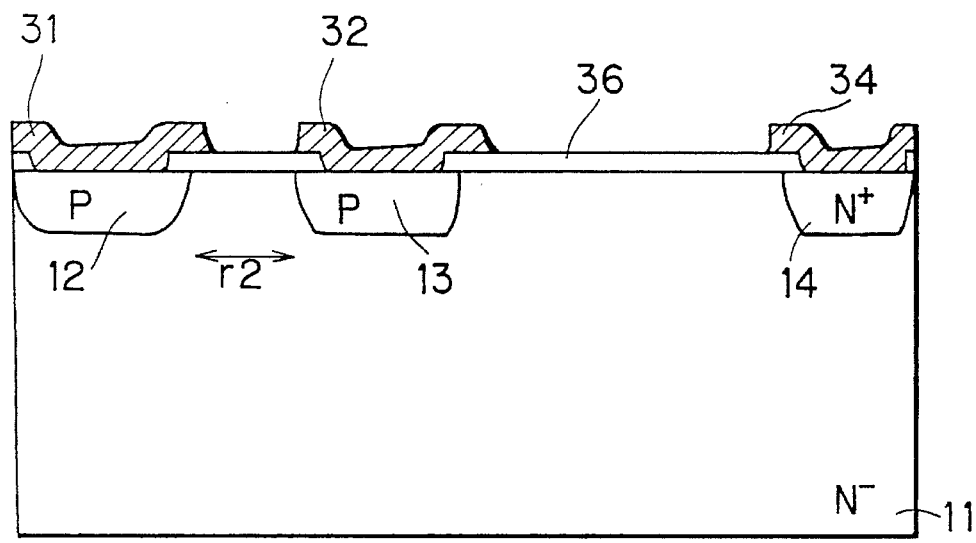
FIG. 12 is a sectional view showing a configuration of the voltage sense device of a second embodiment according to the present invention.

FIG. 12 is a sectional view showing a configuration of a voltage sense device of a second preferred embodiment according to the present invention. As shown in FIG. 12, a P diffusion region 12, a P diffusion region 13 and an N⁺ diffusion region 14 are selectively formed in an N⁻ substrate 11, respectively. An electrode 31 or a first main electrode, a sense electrode 32, and an electrode 34 or a second main electrode are formed on the P diffusion region 12, the P diffusion region 13 and the N⁺ diffusion region 14, respectively. Reference numeral 36 designates an insulating film. A configuration of the voltage sense device of the second preferred embodiment is a variation of the voltage sense device of the first preferred embodiment in which the electrode 33 provided on the second major surface of the N⁻ substrate 11 is replaced with the electrode 34 provided on the first major surface of the N⁻ substrate 11.

Figure 13:
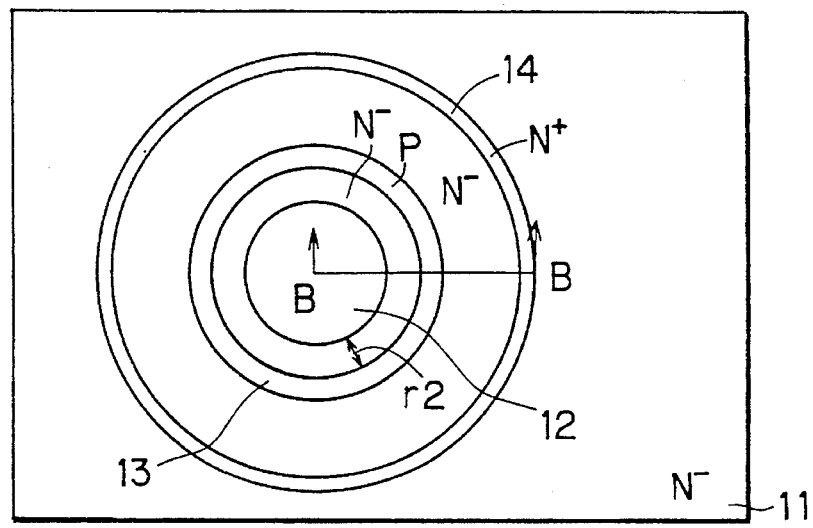
FIG. 13 is a plan view showing a plane configuration of the voltage sense device shown in FIG. 12.
Figure 14:
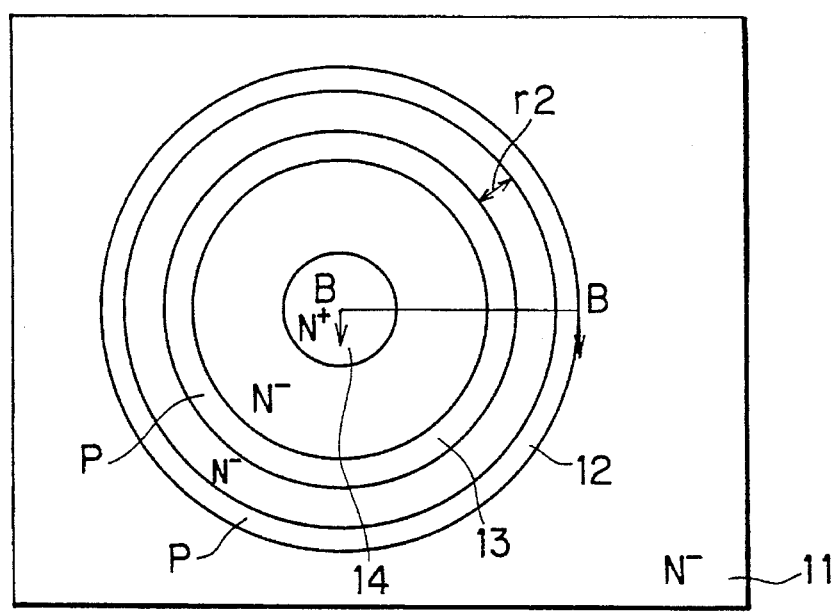
FIG. 14 is a plan view showing a plane configuration of the voltage sense device shown in FIG. 12.

FIGS. 13 and 14 are plan views showing a plane configuration of the second preferred embodiment shown in FIG. 12, and FIG. 12 is a sectional view taken along B—B of FIGS. 13 and 14. The electrodes 31, 32 and 34 and the insulating film 36 are omitted in these figures. In the plane configuration in FIG. 13, the P diffusion region 13 is formed annularly a distance r2 away from the circumference of the circular P diffusion region 12 while the N⁺ diffusion region 14 is formed annularly along the circumference of the P diffusion region 13. In the plane configuration of FIG. 14, the P diffusion region 13 is formed annularly along the circumference of the circular N⁺ diffusion region 14 while the P diffusion region 12 is formed annularly a distance r2 away from the circumference of the P diffusion region 13. Furthermore, the configuration may be an arrangement where the P diffusion region 13 or the N⁺ diffusion region 14 does not completely surround the P diffusion region 12 in FIG. 13, or it may be an arrangement where the P diffusion region 12 or the P diffusion region 13 does not completely surround the N⁺ diffusion region 14 in FIG. 14.

The operation of the voltage sense device of the second preferred embodiment configured in the above-mentioned way is similar to that of the voltage sense device of the first preferred embodiment, and therefore, an explanation about it is omitted.

Now, a method of manufacturing the second preferred embodiment will be described with reference to FIGS. 12 to 14. First, similar to the first preferred embodiment, a P-type impurity is selectively implanted and diffused in the surface of the N⁻ substrate 11 to form the P diffusion regions 12 and 13, while an N-type impurity is selectively implanted and diffused therein to form the N⁺ diffusion region 14. Then, after the insulating film 36 is formed over the N⁻ substrate 11 entire, contact holes are formed in the insulating film 36 on the P diffusion region 13 and the N⁺ diffusion region 14. Then, the electrode 31 is formed on the P diffusion region 12, the sense electrode 32 is formed on the P diffusion region 13, and the electrode 34 is formed on the N⁺ diffusion region 14, and thus, the voltage sense device of the second preferred embodiment is manufactured.

A distance r2 between the P diffusion regions 12 and 13 (see FIGS. 12 to 14) which determines a voltage sense characteristic of the voltage sense device of the second preferred embodiment manufactured in this way can be accurately set as in the first preferred embodiment, and hence, a stable voltage sense characteristic can be gained. Moreover, the above-mentioned manufacturing process is relatively simple.

Figure 15:
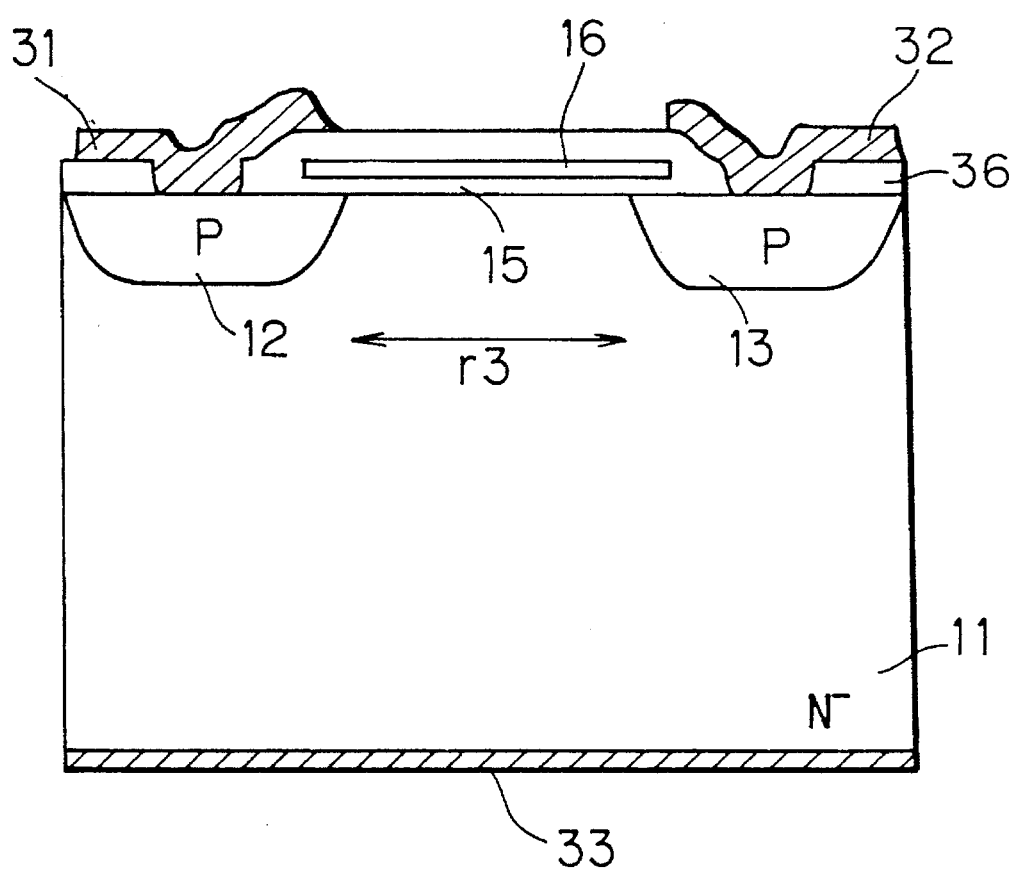
FIG. 15 is a sectional view showing a configuration of the voltage sense device of a third embodiment according to the present invention.

FIG. 15 is a sectional view showing a configuration of the voltage sense device of a third preferred embodiment according to the present invention. As shown in FIG. 15, a P diffusion region 12 and a P diffusion region 13 are selectively formed in an N⁻ substrate 11. Then, a conductive film 16 is formed through an insulating film 15 on the N⁻ substrate 11 between the P diffusion regions 12 and 13. An electrode 31 or a first main electrode is formed on the P diffusion region 12, a sense electrode 32 is formed on the P diffusion region 13, and an electrode 33 or a second main electrode is formed on a second major surface of the N⁻ substrate 11.

Figure 16:
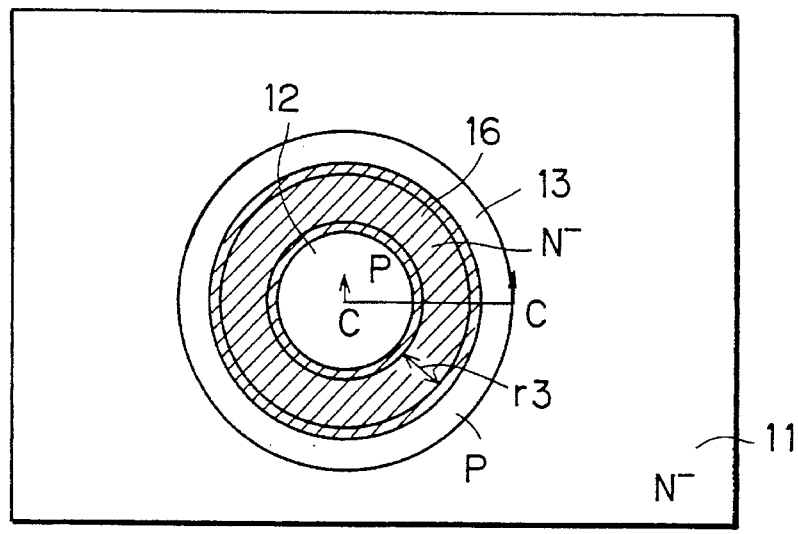
FIG. 16 is a plan view showing a plane configuration of the voltage sense device shown in FIG. 15.
Figure 17:
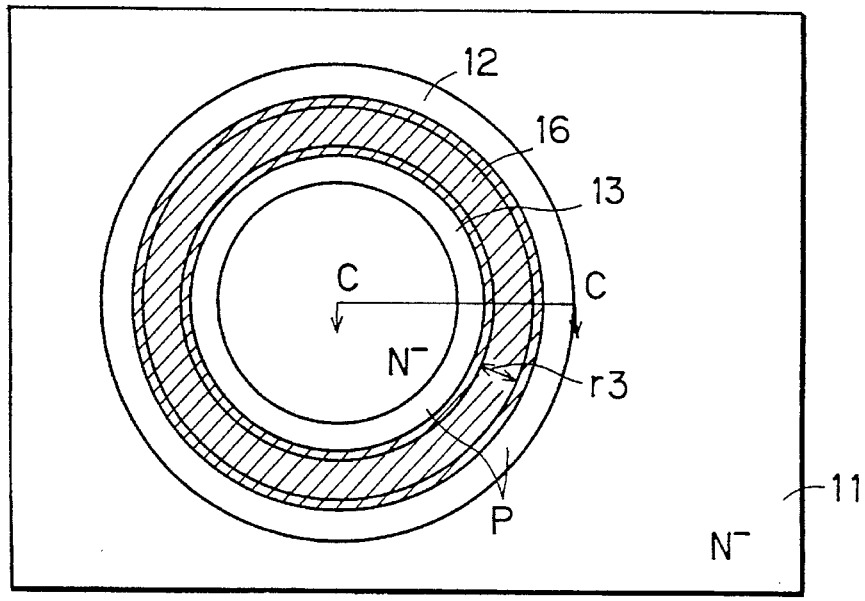
FIG. 17 is a plan view showing a plane configuration of the voltage sense device shown in FIG. 15.

FIGS. 16 and 17 are plan views showing a plane configuration of the third preferred embodiment shown in a section taken along C—C of FIGS. 16 and 17 is shown in FIG. 15. The electrodes 31 and 32 and the insulating film 16 are omitted in these figures. The P diffusion region 13 is formed annularly a distance r3 away from the circumference of the circular P diffusion region 12 in the plane configuration of FIG. 16, while the P diffusion region 12 is formed annularly a distance r3 away from the circumference of the circular P diffusion region 13. Naturally, the configuration may be an arrangement where the conductive film 16 or the P diffusion region 13 does not completely surround the P diffusion region 12 in FIG. 16, or it may be an arrangement where the conductive film 16 or the P diffusion region 12 does not completely surround the P diffusion region 13, or a portion of the P diffusion region 13 is not formed along the conductive film 16 in FIG. 17.

Figure 18:
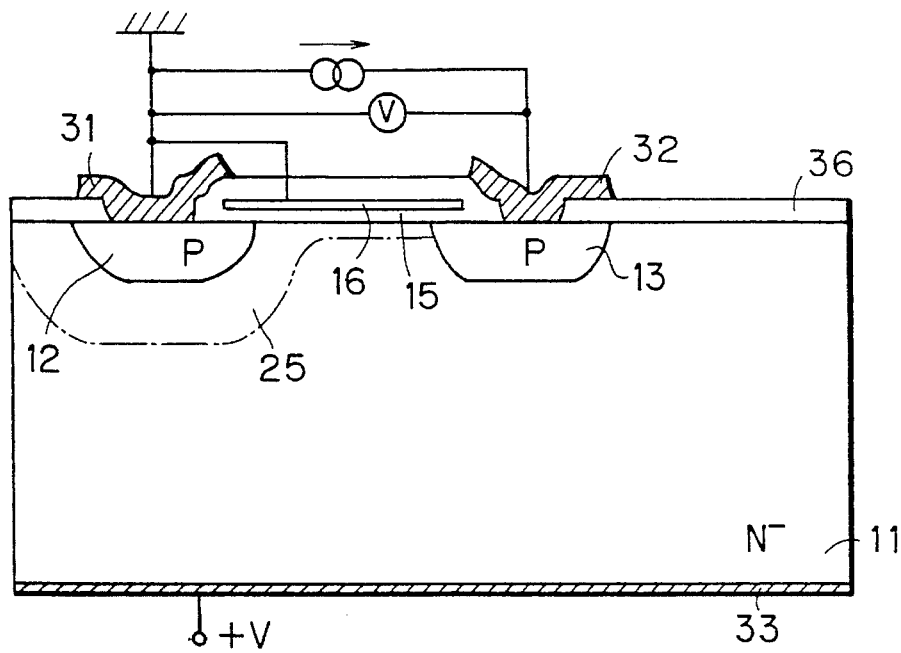
FIG. 18 is a model sectional view for explaining an operation of the voltage sense device of the third embodiment.
Figure 19:
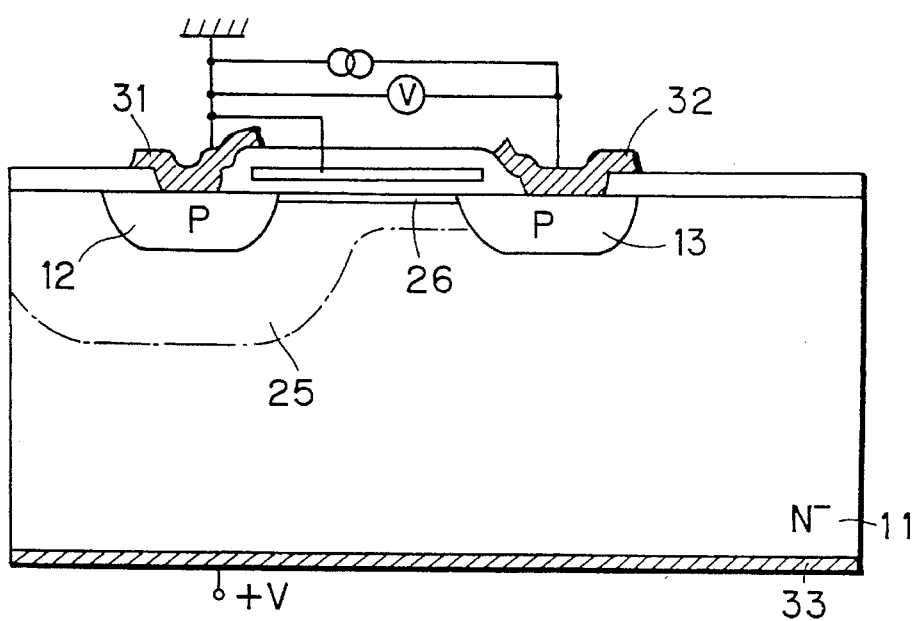
FIG. 19 is a model sectional view for explaining the operation of the voltage sense device of the third embodiment.

FIGS. 18 and 19 are model sectional views for explaining an operation of the voltage sense device of the third preferred embodiment. A voltage sense operation will now be described with reference to these figures.

First, setting the electrode 31 and the conductive film 16 at 0 V in potential and constant current is led to the sense electrode 32 to positively bias the electrode 33, and then, a depletion layer 25 expands from a PN junction developed between the P diffusion region 12 and the N⁻ substrate 11 towards the N⁻ substrate 11. Especially, a surface of the N⁻ substrate 11 just below the conductive film 16 is liable to be depleted because of an influence of an electric field. In practice, there slightly lies a depletion layer between the P diffusion region 13 and the N⁻ substrate 11, but it is not shown in FIGS. 18 and 19 because there is no hindrance against the explanation of a sense characteristic even if an existence of the depletion layer is ignored.

As shown in FIG. 18, when the depletion layer 25 lying in a region other than that just below the conductive film 16 is located apart from the P diffusion region 13, the constant current led to the sense electrode 32 forwardly biases a PN junction of the P diffusion region 13 and the N⁻ substrate 11, but since the surface of the N⁻ substrate 11 just below the conductive film 16 is depleted because of an influence of an electric field of the conductive film 16 and the like, most of hole current flows drifting in the surface of the N⁻ substrate 11 just below the conductive film 16 in most cases. Thus, the sense electrode 32 assumes higher voltage than the voltage at the electrode 33 by a predetermined level but the voltage at the sense electrode 32 is slightly lower than the worth of forward bias at the PN junction of the P diffusion region 13 and the N⁻ substrate 11 because the hold current flows therein. In other words, the voltage at the sense electrode 32 assumes a value slightly lower than the worth of the forward bias between the electrodes 32 and 33 in the voltage sense device of the first preferred embodiment.

Then, as a potential at the electrode 33 rises, the depletion layer 25 expanding from the P diffusion region 12 lies closer to the P diffusion region 13. Then, drift current flowing in the surface of the N⁻ substrate 11 just below the conductive film 16 more easily flows, and the worth of the forward bias at the sense electrode 32 related to the electrode 33 becomes further smaller.

As a potential at the electrode 33 further rises, the depletion layer 25 expanding from the P diffusion region 12 reaches the P diffusion region 13. Then, similar to the first preferred embodiment, the constant current led to the sense electrode 32 all drifts from the P diffusion region 13 to the P diffusion region 12 as hole current. The voltage at the sense electrode 32 is a voltage in floating to which a voltage for holding the constant current is added, and the voltage at the sense electrode 32 is suppressed not to rise in contrast with voltage rising at the electrode 33. At this time, most of the hole current flows in the surface of the N⁻ substrate 11 because of an influence of the conductive film 16. Furthermore, as to the voltage in floating, the voltage at the sense electrode 32 is lower than that in the first preferred embodiment because of a capacitive coupling of the sense electrode 32 with the conductive film 16.

Now, the potential applied to the conductive film 16 will be described in detail.

A potential at the conductive film 16 rising to or over 0 V, as the electric field caused by the conductive film 16 exerts a less effect in the state where the depletion layer 25 does not reach the P diffusion region 13, the voltage at the sense electrode 32 becomes higher than that at the electrode 33 by almost the worth of the forward bias at the PN junction of the P diffusion region 13 and the N⁻ substrate 11, namely, it is almost equal to an amount of the forward bias between the electrodes 32 and 33 in the voltage sense device of the first preferred embodiment. In the state where the depletion layer 25 reaches the P diffusion region 13, the voltage at the sense electrode 32 rises as the potential at the conductive film 16 rises because of the capacitive coupling of the sense electrode 32 with the conductive film 16. On the other hand, the potential at the conductive film 16 falling to or under 0 V, in the state where the depletion layer 25 does not reach the P diffusion region 13, an electric field caused by the conductive film 16 exerts a larger effect, and the sense voltage gradually decreases as the potential at the conductive film 16 falls. In the state where the depletion layer 25 reachs the P diffusion region 13, the voltage at the sense electrode 32 falls as the potential at the conductive film 16 falls because of the capacitive coupling of the sense electrode 32 with the conductive film 16. Moreover, as shown in FIG. 19, the potential at the conductive film 16 having sufficiently fallen, a P inversion layer 26 is formed in the surface of the N⁻ substrate 11 just below the conductive film 16. P inversion layer 26, once formed, short-circuits the electrode 31 and the sense electrode 32, and therefore, the potential at the sense electrode 32 never rise from 0 V, the voltage sense device no longer perform its voltage sense function. Also, when the depletion layer 25 reachs the P diffusion region 13, the similar effect is attained.

In this way, appropriately setting a potential at the conductive film 16 having the above-mentioned property (e.g., at 0 V), a voltage characteristic of the sense voltage V32 obtained at the sense electrode 32 can be set at a desired state.

Now, a method of manufacturing the third preferred embodiment will be described with reference to FIGS. 15 to 17. First, an insulating film 15 is formed in the first major surface of the N⁻ substrate 11, and then, conductive film 16 is formed on the insulating film 15. Then, the conductive film 16 is patterned. After that, the entire surface is coated with resist, and then, the resist is patterned. After a P-type impurity is implanted using a mask of the patterned resist and the conductive film 16, the impurity is diffused to form the P diffusion regions 12 and 13. Then, an insulating film 36 is formed over the entire surface of the N⁻ substrate 11, and thereafter, contact holes are formed in the insulating film 36 on the P diffusion regions 12 and 13. Then, the electrode 31 is formed on the P diffusion region 12, the sense electrode 32 is formed on the P diffusion region 13, and the electrode 33 is formed on the second major surface of the N⁻ substrate 11, and thus, the voltage sense device of the third preferred embodiment is manufactured.

In forming the P diffusion regions 12 and 13, the P diffusion regions 12 and 13 may be selectively formed in the first major surface of the N⁻ substrate 11 indifferent of the conductive layer 16, as in the first and second preferred embodiments, namely, without a mask of the conductive film 16 as mentioned above.

A distance r3 between the P diffusion regions 12 and 13, which determines a voltage sense characteristic of the voltage sense device of the third preferred embodiment manufactured in the above-mentioned way (see FIGS. 15 to 17), can be accurately set as in the first preferred embodiment, and hence, a stable voltage sense characteristic can be obtained. Also, applying adequate voltage to the conductive film 16, the voltage sense characteristic can be effectively set with a wide variety, and moreover, the above mentioned manufacturing process is relatively simple.

The third preferred embodiment may have a configuration in which a region corresponding to the N⁺ diffusion region 14 in the first major surface of the N⁻ substrate 11 is provided as in the second preferred embodiment while the electrode 33 formed in the second major surface of the N⁻ substrate 11 is replaced with an electrode corresponding to the electrode 34 in a region corresponding to the N⁺ diffusion region (this embodiment is referred to as "a variation of the third preferred embodiment" hereinafter). In such a configuration, a similar effect can be attained to the third preferred embodiment.

A method of manufacturing a variation of the third preferred embodiment will now be described. First, an insulating film 15 is formed in a first major surface of an N⁻ substrate 11, and a conductive film 16 is formed on the insulating film 15. Then, the conductive film 16 is patterned, and the entire surface is coated with resist. Then, the resist is patterned and a P-type impurity is selectively implanted with a mask of the patterned resist and the conductive film 16. The impurity is diffused to form P diffusion regions 12 and 13. Then, an N-type impurity is selectively implanted and diffused to form a region corresponding to the N⁺ diffusion region 14. After an insulating film 36 is formed over the entire surface of the N⁻ substrate 11, contact holes are formed in the insulating film 36 on the P diffusion regions 12 and 13 and a region corresponding to the N⁺ diffusion region 14. After that, an electrode 31 is formed on the P diffusion region 12, a sense electrode 32 is formed on the P diffusion region 13, and an electrode corresponding to the electrode 34 is formed on the region corresponding to the N⁺ diffusion region 14, and thus, the voltage sense device of the variation of the third preferred embodiment is manufactured.

Figure 20:
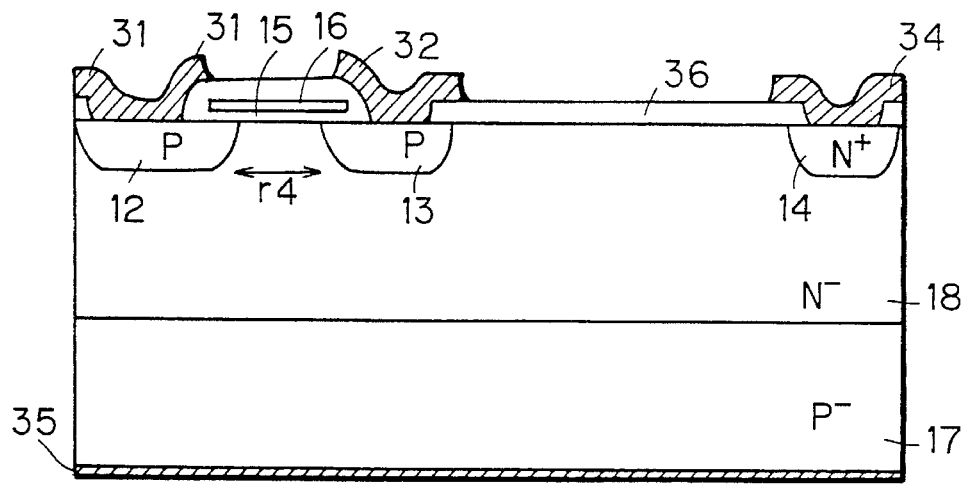
FIG. 20 is a sectional view showing a configuration of the voltage sense device of a fourth embodiment according to the present invention.

FIG. 20 is a sectional view showing a configuration of the voltage sense device of the fourth preferred embodiment according to the present invention. As shown in FIG. 20, an N⁻ layer 18 is formed on a first major surface of a P⁻ substrate 17, and a P diffusion region 12, a P diffusion region 13 and an N⁺ diffusion region 14 are selectively formed in the N⁻ layer 18. Then, a conductive film 16 is formed through an insulating film 15 on the N⁻ substrate 18 between the P diffusion regions 12 and 13. An electrode 31 or a first main electrode is formed on the P diffusion region 12 while a sense electrode 32 is formed on the P diffusion region 13. An electrode 35 or a third main electrode is formed on a second major surface of the P⁻ substrate 17 while an electrode 34 or a second main electrode is formed on the N⁺ diffusion region 14.

Figure 21:
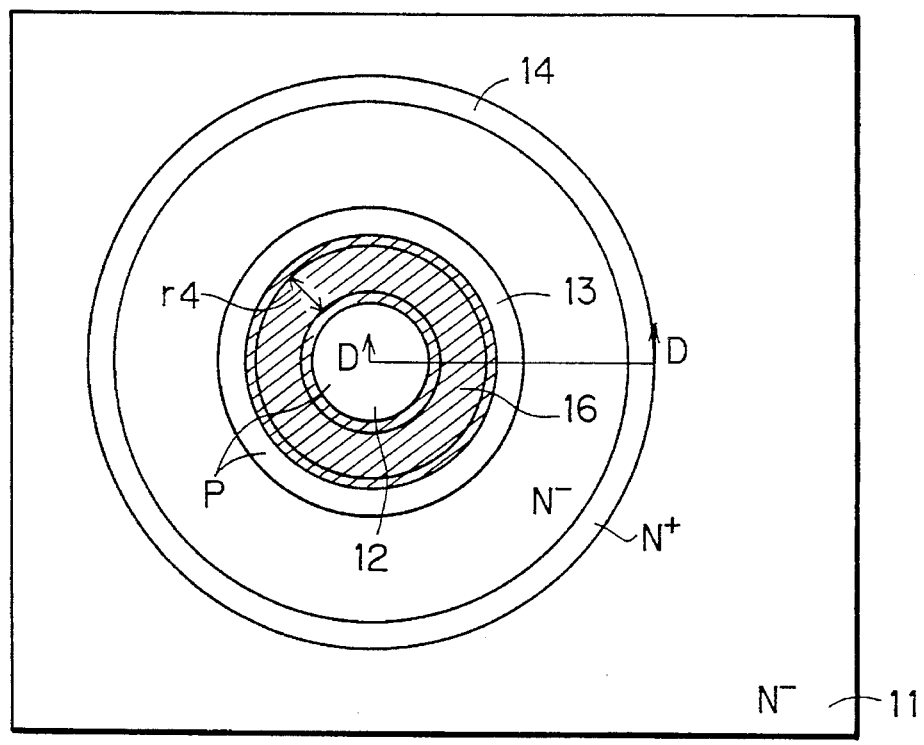
FIG. 21 is a plan view showing a plane configuration of the voltage sense device shown in FIG. 20.
Figure 22:
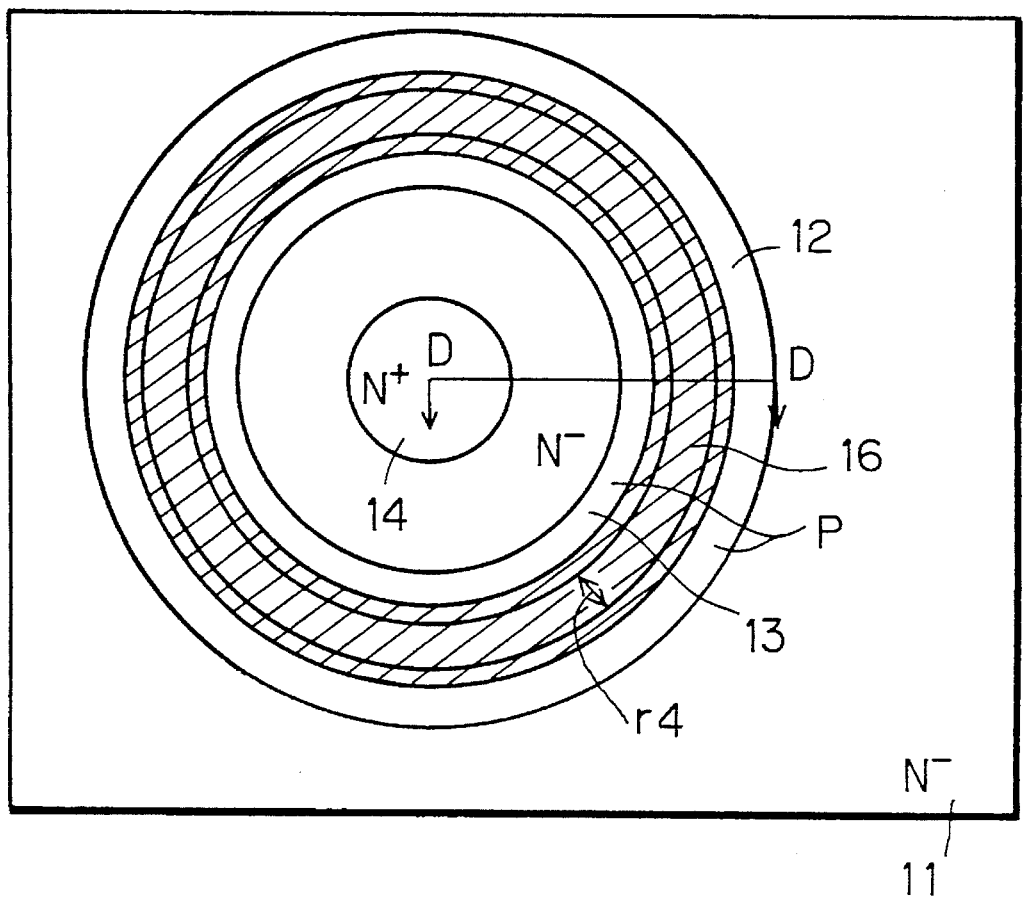
FIG. 22 is a plan view showing a plane configuration of the voltage sense device shown in FIG. 20.

FIGS. 21 and 22 are plan views showing a plane configuration of the fourth preferred embodiment shown in FIG. 20, and a section taken along D—D of FIGS. 21 and 22 is FIG. 20. The electrodes 31, 32, 33 and 35 and the insulating film 36 are omitted in these figures. In the plane configuration of FIG. 21, the P diffusion region 13 is formed annularly a distance r4 away from the circumference of the circular P diffusion region 12, and the N⁺ diffusion region 14 is formed annularly along the circumference of the P diffusion region 13. In the plane configuration of FIG. 22, the P diffusion region 13 is formed annularly along the circumference of the circular P diffusion region 14, and the P diffusion region 12 is formed annularly a distance r4 away from the circumference of the P diffusion region 13. In FIG. 21, there may be a configuration in which the conductive film 16, the P diffusion region 13 or N⁺ diffusion region 14 does not completely surround the P diffusion region 12, or in FIG. 22, there may be a configuration in which P diffusion region 13, the conductive film 16 or the P diffusion region 12 does not completely surround the P diffusion region 14.

Figure 23:
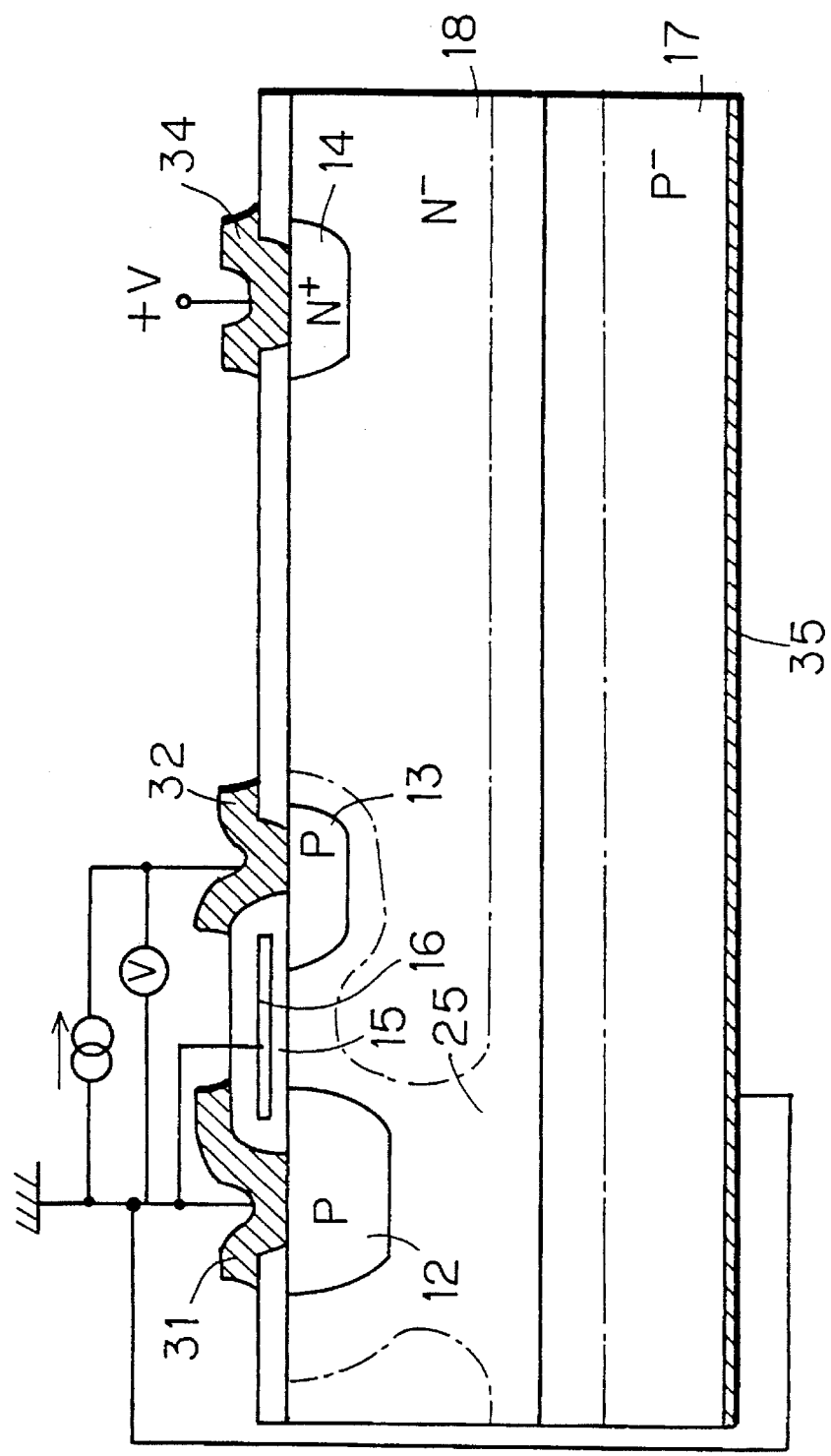
FIG. 23 is a model sectional view for explaining an operation of the voltage sense device of the fourth embodiment.
Figure 24:
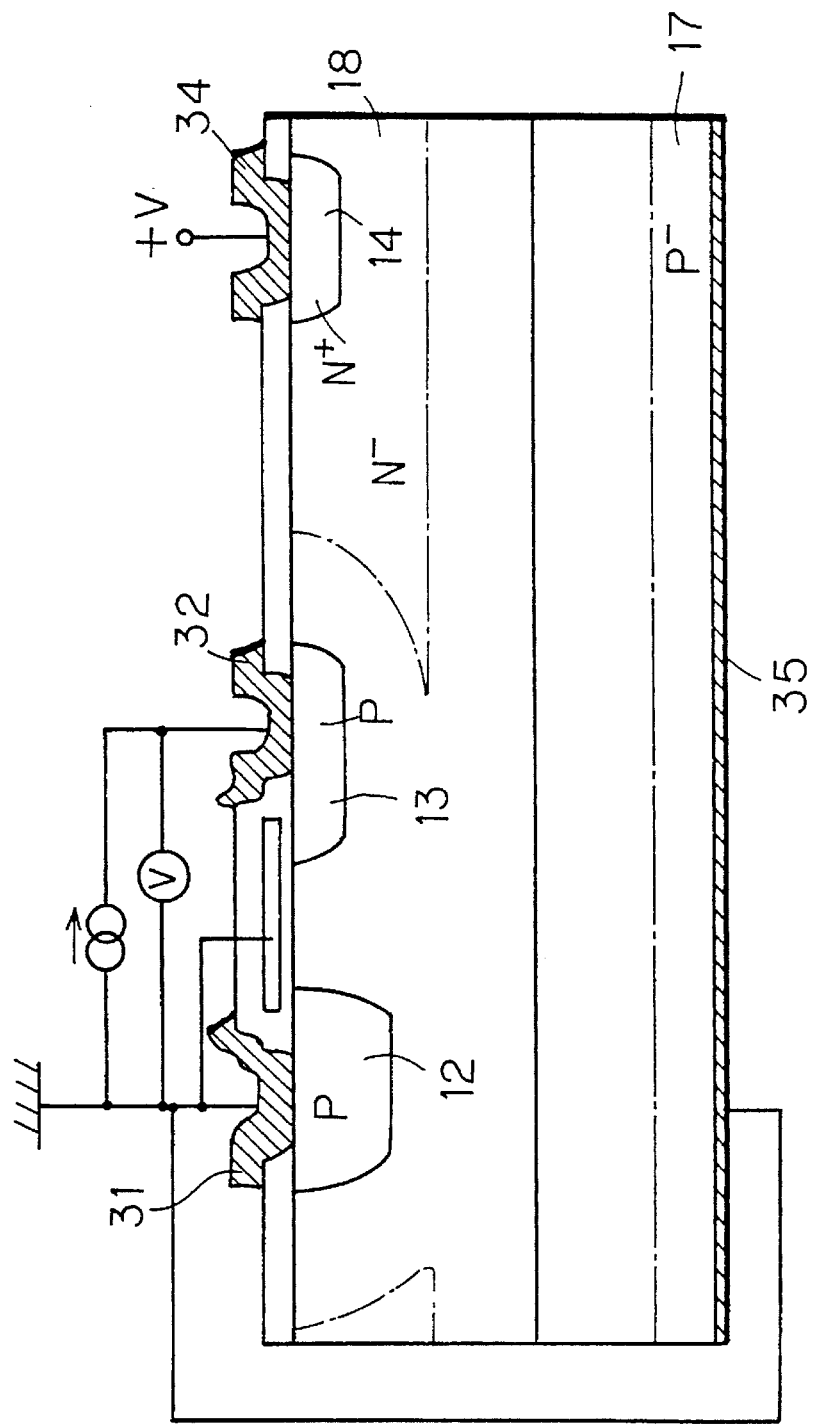
FIG. 24 is a model sectional view for explaining the operation of the voltage sense device of the fourth embodiment.

FIGS. 23 and 24 are model sectional views for explaining an operation of the voltage sense device of the fourth preferred embodiment. Now, the voltage sense operation will be described with reference to these figures. A basic operation of the voltage sense device of the fourth preferred embodiment is similar to the operation of the voltage sense device of the third preferred embodiment, and therefore, only aspects different from the third preferred embodiments will be explained below.

As the electrodes 31 and 35 and the conductive film 16 are set at 0 V and constant current is led to the sense electrode 32 to positively bias the electrode 34, a depletion layer 24 expands from PN junctions between the P diffusion region 12 and N⁻ layer 18 and between the P⁻ substrate 17 and N⁻ layer 18 towards the N⁻ layer 18. In practice, a depletion layer slightly lies between the P diffusion region 13 and the N⁻ layer 18, but FIGS. 23 and 24 do not show it because there is no hindrance to the explanation of a sense characteristic even if an existence of the depletion layer is ignored.

In the case of a configuration, as shown in FIG. 23, where a distance between a bottom of the P diffusion region 12 and an upper surface of the P⁻ substrate 17 is relatively small and therefore a depletion layer 25 extending from the P diffusion region 12 and a depletion layer 25 extending from the P⁻ substrate 17 join together very soon, an expansion of the depletion layer 25 towards the P diffusion region 13 becomes large. Hence, voltage V34 at the electrode 34 is sent to the P diffusion region 13 at a lower value than the voltage V33 at the electrode 33 in the third preferred embodiment. Specifically, the depletion layer 25 expanding from the P⁻ substrate 17 functions to suppress an extent of the voltage rising at the sense electrode 32.

When the applied voltage V34 to the electrode 34 is caused to further rise, a depletion layer from the P⁻ substrate 17 and a depletion layer from the P diffusion region 13 join together as shown in FIG. 24. As a result, pinch-off is caused because of a JFET mentioned in the prior art embodiment, and therefore, an electric field in a region extending from the P diffusion region 13 to the P diffusion region 12 hardly vary after that. Thus, the voltage at the sense electrode 32 no longer vary, too.

The above-mentioned JFET causes an maximum pinch-off effect when the P diffusion region 13 lies separating the P diffusion region 12 from the N⁺ diffusion region 14 in a plane as shown in FIGS. 21 and 22. Thus, in a configuration where none of the P diffusion region 13 is partially interposed between the P diffusion region 12 and N⁺ diffusion region 14 in a plane, the above-mentioned pinch-off might be slightly less effective.

The fourth preferred embodiment is greatly different from the third preferred embodiment in that the pinch-off effect because of a JFET is exerted. A pinch-off effect of a JFET which is employed in the prior art embodiment is used to suppress the sense voltage V32 in the fourth preferred embodiment. Although the prior art embodiment gains a voltage sense characteristic depending only upon a pinch-off characteristic of a JFET, the fourth preferred embodiment gains a voltage sense characteristic basically using a scheme stated in the third preferred embodiment, and as a voltage finally clamped alone is used for the pinch-off characteristic of the JFET, an influence which variations of various parameters for determining the pinch-off effect of the JFET have upon the voltage sense characteristic of the fourth preferred embodiment is extremely small.

Figure 25:
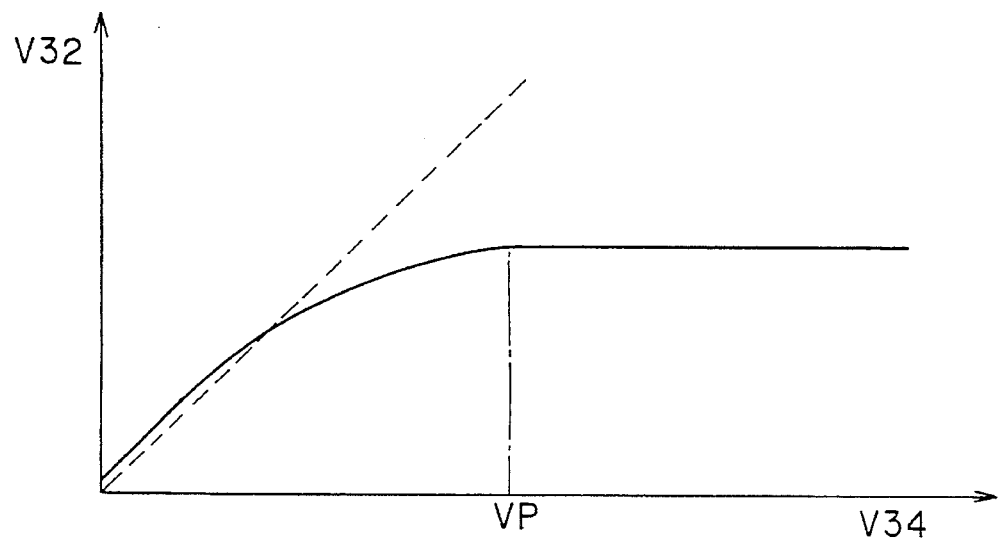
FIG. 25 is a graph showing a voltage sense characteristic of the voltage sense device of the fourth embodiment.

FIG. 25 is a graph showing a voltage sense characteristic of the voltage sense device of the first preferred embodiment. A potential at the conductive film 16 at this time is 0 V. Referring to FIG. 25, it will be recognized that an extent of the rising of the sense voltage V32 obtained at the sense electrode 32 related to the applied voltage V34 at the electrode 34 keeps low after the applied voltage V34 reaches the voltage VP at which a JFET of the P⁻ substrate 11 and P diffusion region 13 pinches off.

Figure 26:
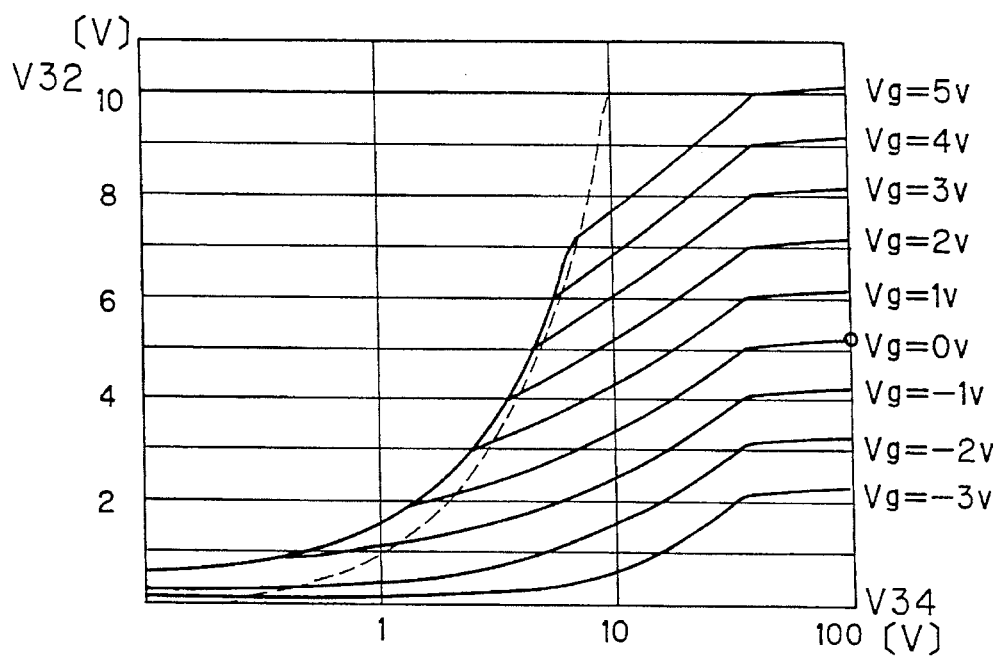
FIG. 26 is a graph showing a voltage sense characteristic of the voltage sense device of the fourth embodiment.
Figure 27:
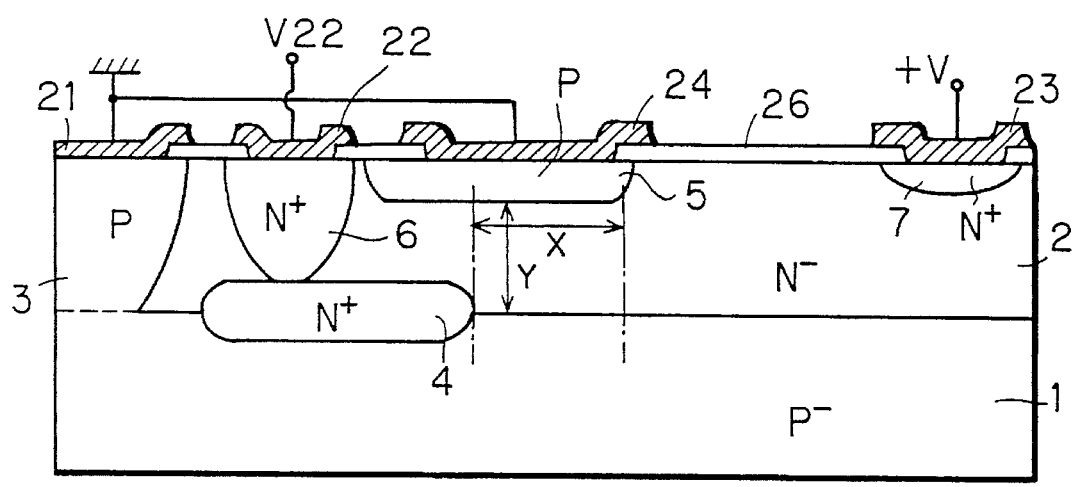
FIG. 27 is a sectional view showing a configuration of a conventional voltage sense device.
Figure 28:
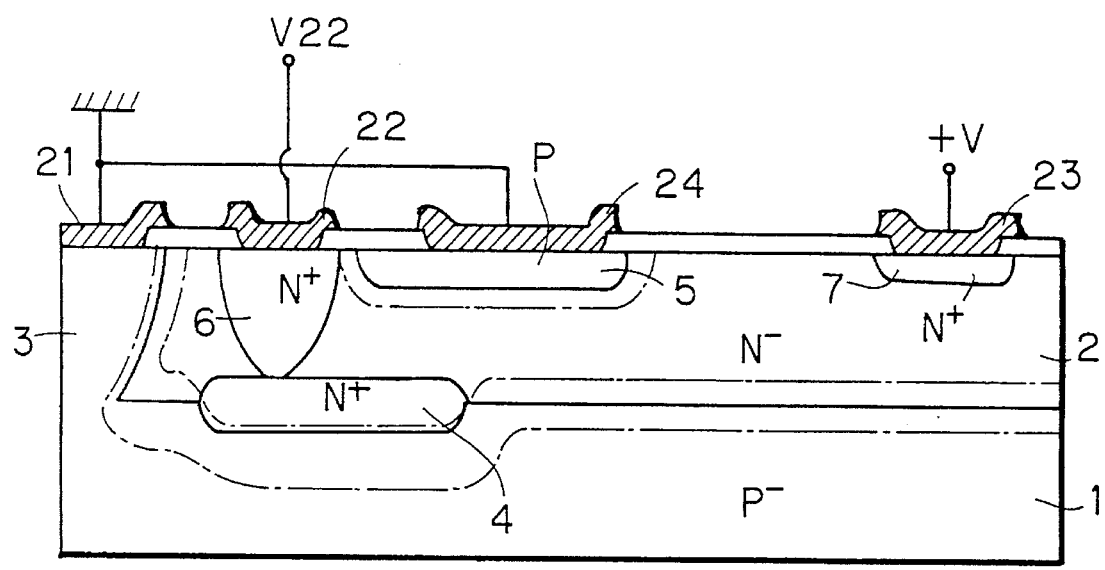
FIG. 28 is a model sectional view for explaining an operation of the conventional voltage sense device.
Figure 29:
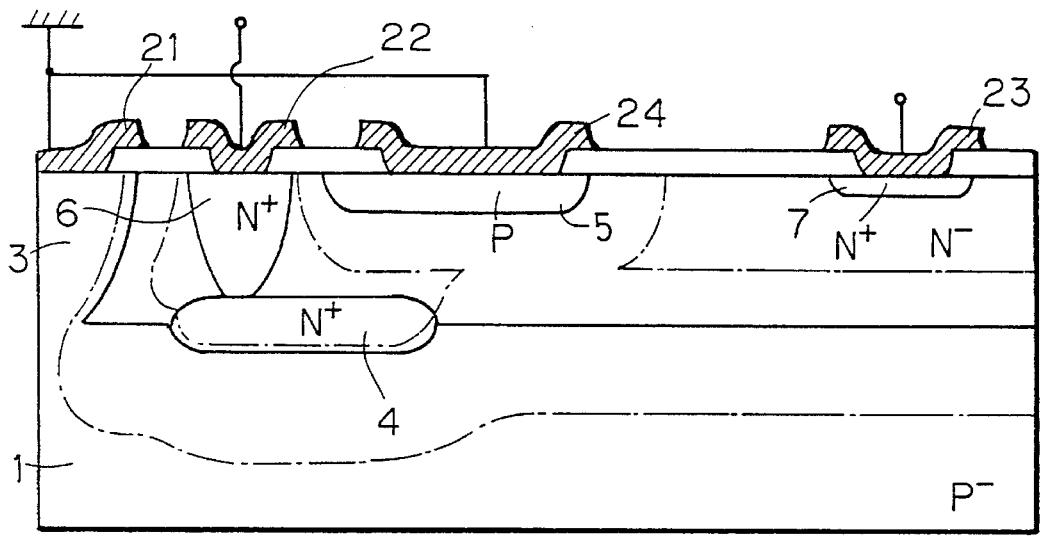
FIG. 29 is a model sectional view for explaining the operation of the conventional voltage sense device.
Figure 30:
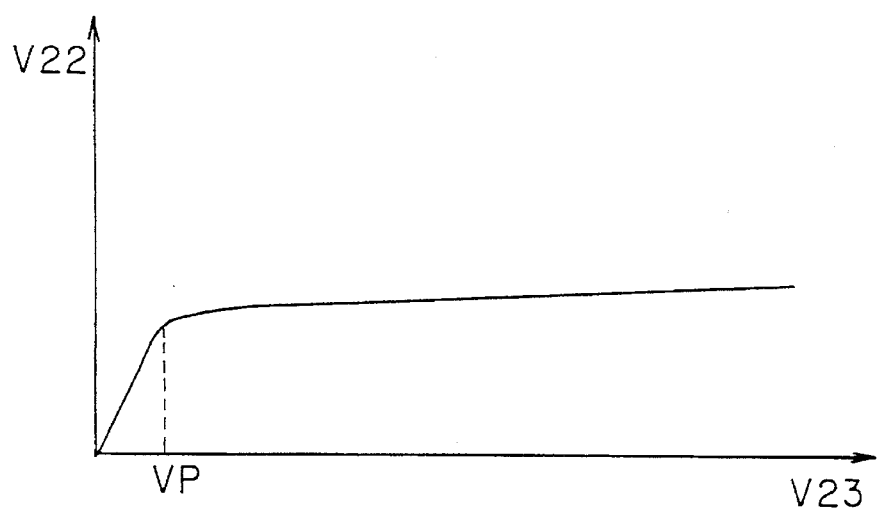
FIG. 30 is a graph showing a sense voltage characteristic of the voltage sense device.

FIG. 26 is a graph showing a voltage sense characteristic when voltage Vg applied to the conductive film 16 is varied. At this time, current let to the sense electrode 32 is fixed 100 μA. As shown in FIG. 26, varying the voltage Vg at the conductive film 16, a variety of voltage sense characteristic can be gained. Reference character Vp designates a pinch-off voltage.

Now, a method of manufacturing the fourth preferred embodiment will be described in conjunction with FIGS. 20 to 22. First, the N⁻ layer 18 is formed on the P⁻ substrate 17 by means of an epitaxial growing method or the like. Then, the insulating film 15 is formed in the surface of the N⁻ layer 18 and conductive film is formed in the insulating film 15. Then, the conductive film 16 is patterned and the entire surface is coated with resist. The resist is patterned, and thereafter, a P-type impurity is implanted with a mask of the patterned resist and conductive film 16 and diffused to form the P diffusion regions 12 and 13. After that, an N-type impurity is selectively implanted and diffused to form the N⁺ diffusion region 14. Then, after the insulating film 36 is formed over the entire surface of the N⁻ layer 18, contact holes are formed in the insulating film 36 on the P diffusion region 12, P diffusion region 13 and N⁺ diffusion region 14. After that, the electrode 31 is formed on the P diffusion region 12, the sense electrode 32 is formed on the P diffusion region 13, the electrode 34 is formed on the N⁺ diffusion region 14, and the electrode 35 is formed on a second major surface of the P⁻ substrate 17, and thus, the voltage sense device of the fourth preferred embodiment is manufactured.

There may be a method in which the P diffusion regions 12 and 13 are selectively formed in the surface of the N⁻ layer 18 indifferent of the conductive film 16 as in the first and second preferred embodiments, namely, without using a mask of the conductive film 16 in forming the P diffusion regions 12 and 13 as stated in the above.

A distance r4 between the P diffusion regions 12 and 13 which determines a voltage sense characteristic of the voltage sense device of the fourth preferred embodiment manufactured in the above mentioned way (see FIGS. 20 to 22) can be accurately set as in the first preferred embodiment, and hence, a stable voltage sense characteristic can be obtained. Also, similar to the third preferred embodiment, applying an adequate voltage to the conductive film 16, a variety of voltage sense characteristic can be set. Additionally, as a unique effect in the fourth preferred embodiment, the voltage sense device has an effective function of the pinch-off of the JFET at a high voltage sense time. The above-mentioned manufacturing process is relatively simple.

The fourth preferred embodiment may have a configuration without the conductive film 16 (this is called a "variation of the fourth preferred embodiment" herein after). The variation of the fourth preferred embodiment basically operates as the first preferred embodiment operates, and it also has an effect of the pinch-off characteristic of the JFET of the fourth preferred embodiment.

Now, a method of manufacturing the variation of the fourth preferred embodiment will be described. First, an N⁻ layer 18 is formed on a P⁻ substrate 17 by means of an epitaxial growing method or the like. After an oxidation film is formed in a surface of the N⁻ layer 18, the surface of the film is coated with resist, and the resist is patterned. A P-type impurity is implanted as a mask of the patterned resist and then diffused to form P diffusion regions 12 and 13. Then, an N-type impurity is selectively implanted and diffused to form the N⁺ diffusion region 14. Then, the insulating film 36 is formed over the entire surface of the N⁻ layer 18, and thereafter, contact holes are formed in the insulating film 36 on the P diffusion region 12, P diffusion region 13 and N⁺ diffusion region 14. After that, an electrode 31 is formed on the P diffusion region 12, a sense electrode 32 is formed on the P diffusion region 13, an electrode 34 is formed on the N⁺ diffusion region 14, and an electrode 35 is formed on a second major surface of the P⁻ substrate 17, and thus, the voltage sense device of the variation of the fourth preferred embodiment is manufactured.

As has been described, in the semiconductor device as defined in claims 1 and 2 of the present invention, voltage is applied to first and second main electrodes so that a PN junction formed in the interface between a semiconductor substrate and a first semiconductor region may have a reverse bias and constant current flows in a sense electrode, and consequently, a difference between potentials at the first and second main electrodes becomes larger, a depletion layer formed from the PN junction expands, and because of an existence of the depletion layer, a voltage sense characteristic can be obtained that an extent of the rising of the potential at the sense electrode is suppressed as the potential difference between the first and second main electrodes which are at higher level.

The voltage sense characteristic depends upon a distance between the first and second semiconductor regions, but the first and second semiconductor regions can be simultaneously formed in the same manufacturing process, and hence, a distance between the first and second semiconductor regions can be accurately set.

As a result, a good voltage sense characteristic can be obtained, and moreover, the manufacturing process is relatively simple.

While the invention has been shown and described in detail, the foregoing description is in all aspects illustrative and not restrictive. It is therefore understood that numerous modifications and variations can be devised without departing from the scope of the invention.

We claim:

1. A semiconductor voltage sensing device comprising:

a semiconductor substrate of a first conductivity type having first and second major surfaces;

a first semiconductor region of a second conductivity type selectively formed in said first major surface of said semiconductor substrate;

a second semiconductor region of said second conductivity type selectively formed in said first major surface of said semiconductor substrate independent of said first semiconductor region;

a first main electrode formed on said first semiconductor region;

a sense electrode formed on said second semiconductor region; and a constant current source which is connected across the first main electrode and the sense electrode to supply a constant current to said sense electrode;

a second main electrode formed on said second major surface of said semiconductor substrate, said first and second main electrodes respectively being supplied with voltage to reverse bias a region between said first and second main electrodes, and wherein a potential difference between said first and second main electrodes is sensed as a function of a sense voltage provided by said sense electrode.

2. A device according to claim 1, wherein said first semiconductor region is formed circular in plane configuration.

3. A device according to claim 2, wherein said second semiconductor region is formed annular in plane configuration in a position a predetermined distance away from the circumference of said first semiconductor region.

4. A device according to claim 3, wherein said first conductivity type is an N type while said second conductivity type is a P type.

5. A device according to claim 1, wherein said second semiconductor region is formed circular in plane configuration while said first semiconductor region is formed annular in plane configuration in a position a predetermined distance away from the circumference of said second semiconductor region.

6. A device according to claim 1, further comprising an insulating film formed on said semiconductor substrate between said first semiconductor region and said second semiconductor region; and a control electrode formed on said insulating film.

7. A device according to claim 6, wherein said first semiconductor region is formed circular in plane configuration while said second semiconductor region formed annular in plane configuration in a position a predetermined distance away from the circumference of said first semiconductor region.

8. A device according to claim 6, wherein said second semiconductor region is formed circular in plane configuration while said second semiconductor region is formed annular in plane configuration in a position predetermined distance away from the circumference of said second semiconductor region.

9. A semiconductor voltage sensing device comprising:

a semiconductor substrate of a first conductivity type having first and second major surfaces;

a first semiconductor region of a second conductivity type selectively formed in said first major surface of said semiconductor substrate;

a second semiconductor region of said second conductivity type selectively formed in said first major surface of said semiconductor substrate independent of said first semiconductor region;

a third semiconductor region of said first conductivity type selectively formed in said first major surface of said semiconductor substrate independent of said first and second semiconductor regions;

a first main electrode formed on said first semiconductor region;

a sense electrode formed on said second semiconductor region;

a constant current source which is connected across the first main electrode and the sense electrode to supply a constant current to said sense electrode; and a second main electrode formed on said third semiconductor region, said first and second main electrodes respectively being supplied with voltage to reverse bias a region between said first and second main electrodes, and wherein a potential difference between said first and second main electrodes is sensed as a function of a sense voltage provided by said sense electrode.

10. A device according to claim 9, wherein said first semiconductor region is formed circular in plane configuration, said second semiconductor region is formed annular in plane configuration in a position a predetermined distance away from the circumference of said first semiconductor region, and said third semiconductor region is formed annular in plane configuration along the circumference of said second semiconductor region.

11. A device according to claim 9, wherein said third semiconductor region is formed circular in plane configuration, said second semiconductor region is formed annular in plane configuration along the circumference of said third semiconductor region, and said first semiconductor region is formed annular in plane configuration in a position a predetermined distance away from the circumference of said second semiconductor region.

12. A device according to claim 9, further comprising an insulating film formed on said semiconductor substrate between said first and second semiconductor regions; and a control electrode formed on said insulating film.

13. A semiconductor voltage sensing device comprising:

a semiconductor substrate of a second conductivity type having first and second major surfaces;

a semiconductor layer of a first conductivity type formed on said first major surface of said semiconductor substrate;

a first semiconductor region of said second conductivity type selectively formed in a surface of said semiconductor layer;

a second semiconductor region of said second conductivity type selectively formed in said surface of said semiconductor layer independent of said first semiconductor region;

a third semiconductor region of said first conductivity type selectively formed in a surface of said semiconductor layer independent of said first and second semiconductor regions;

a first main electrode formed on said first semiconductor region;

a sense electrode formed on said second semiconductor region;

a second main electrode formed on said third semiconductor region; and a third main electrode formed on said second major surface of said semiconductor substrate;

wherein a potential difference between said first and second main electrodes is sensed as a function of a sense voltage provided by said sense electrode.

14. A device according to claim 13, further comprising an insulating film formed on said semiconductor layer between said first and second semiconductor regions; and a control electrode formed on said insulating film.

15. A device according to claim 14, wherein said first semiconductor region is formed circular in plane configuration, said second semiconductor region is formed annular in plane configuration in a position a predetermined distance away from the circumference of said first semiconductor region, and said third semiconductor region is formed annular in plane configuration along the circumference of said second semiconductor region.

16. A device according to claim 14, wherein said third semiconductor region is formed circular in plane configuration, said second semiconductor region is formed annular in plane configuration along the circumference of said third semiconductor region, and said first semiconductor region is formed annular in plane configuration in a position a predetermined distance away from the circumference of said second semiconductor region.

* * * * *

UNITED STATES PATENT AND TRADEMARK OFFICE
CERTIFICATE OF CORRECTION

PATENT NO. : 5,574,303
DATED : November 12, 1996
INVENTOR(S) : Tomohide TERASHIMA, et al.

It is certified that error appears in the above-indentified patent and that said Letters Patent is hereby corrected as shown below:

On the title page in Items [19] and [75], the first inventor's last name is spelled incorrectly. It should read:

-- TERASHIMA --

Signed and Sealed this

Eighth Day of April, 1997

Attest:

BRUCE LEHMAN

Attesting Officer

Commissioner of Patents and Trademarks